United States Patent
Kim et al.

(10) Patent No.: US 9,865,541 B2
(45) Date of Patent: Jan. 9, 2018

(54) MEMORY DEVICE HAVING CELL OVER PERIPHERY STRUCTURE AND MEMORY PACKAGE INCLUDING THE SAME

(71) Applicant: SAMSUNG ELECTRONICS CO., LTD., Suwon-si, Gyeonggi-Do (KR)

(72) Inventors: Chang-Bum Kim, Seoul (KR); Sung-Hoon Kim, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/273,268

(22) Filed: Sep. 22, 2016

(65) Prior Publication Data

US 2017/0179027 A1  Jun. 22, 2017

(30) Foreign Application Priority Data

Dec. 17, 2015 (KR) ........................ 10-2015-0180976

(51) Int. Cl.
- *H01L 23/528* (2006.01)
- *H01L 27/112* (2006.01)
- *H01L 25/07* (2006.01)
- *H01L 27/11519* (2017.01)
- *H01L 27/11529* (2017.01)
- *H01L 27/11556* (2017.01)
- *H01L 27/11565* (2017.01)

(Continued)

(52) U.S. Cl.
CPC ........ *H01L 23/5283* (2013.01); *H01L 25/072* (2013.01); *H01L 27/11286* (2013.01); *H01L 27/11519* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ............. H01L 23/5283; H01L 25/0655; H01L 25/072; H01L 27/10897; H01L 27/1116; H01L 27/11286; H01L 27/11529; H01L 27/11573; H01L 29/7827
See application file for complete search history.

(56) References Cited

U.S. PATENT DOCUMENTS

| | | |
|---|---|---|
| 7,009,208 B2 | 3/2006 | Aratani et al. |
| 8,288,816 B2 | 10/2012 | Komori et al. |
| 8,338,882 B2 | 12/2012 | Tanaka et al. |

(Continued)

FOREIGN PATENT DOCUMENTS

KR   1020060091362   8/2006

*Primary Examiner* — Stephen W Smoot
(74) *Attorney, Agent, or Firm* — F. Chau & Associates, LLC

(57) ABSTRACT

A memory device includes a substrate, and a peripheral circuit disposed on a first surface of the substrate. The peripheral circuit includes a first transistor. The memory device further includes a first wiring layer disposed on the peripheral circuit, a base layer disposed on the first wiring layer, a memory cell array disposed on the base layer, and a second wiring layer disposed on the memory cell array. The second wiring layer includes a first power wiring configured to supply a first voltage, a second power wiring configured to supply a second voltage, and a first wiring electrically connected to the first transistor. The first wiring is configured to be electrically connectable to either the first power wiring or the second power wiring.

20 Claims, 22 Drawing Sheets

(51) Int. Cl.
*H01L 27/11573* (2017.01)
*H01L 27/11582* (2017.01)

(56) References Cited

U.S. PATENT DOCUMENTS

| | | | |
|---|---|---|---|
| 8,482,049 B2 | 7/2013 | Son et al. | |
| 8,779,432 B2 | 7/2014 | Yamazaki et al. | |
| 9,042,161 B2 | 5/2015 | Koyama et al. | |
| 2015/0102346 A1 | 4/2015 | Shin et al. | |
| 2015/0129878 A1* | 5/2015 | Shin | H01L 27/11578 257/66 |
| 2015/0145015 A1 | 5/2015 | Shin et al. | |
| 2015/0162341 A1 | 6/2015 | Aritome | |
| 2016/0086967 A1* | 3/2016 | Lee | H01L 27/1157 365/185.18 |
| 2016/0307632 A1* | 10/2016 | Lee | G11C 16/14 |
| 2016/0307910 A1* | 10/2016 | Son | H01L 27/0688 |

\* cited by examiner

MEMORY DEVICE HAVING CELL OVER PERIPHERY STRUCTURE AND MEMORY PACKAGE INCLUDING THE SAME

CROSS-REFERENCE TO RELATED APPLICATION

This application claims priority under 35 USC §119 to Korean Patent Application No. 10-2015-0180976, filed on Dec. 17, 2015, in the Korean Intellectual Property Office, the disclosure of which is incorporated by reference herein in its entirety.

TECHNICAL FIELD

Example embodiments of the present inventive concept relate generally to memory devices, and more particularly, to memory devices having a cell over periphery (COP) structure and memory packages including the memory devices.

DISCUSSION OF THE RELATED ART

Vertical memory devices, also know as three-dimensional (3D) memory devices are memory devices that include a plurality of memory cells stacked repeatedly on a surface of a substrate. These memory devices are able to have a very high storage capacity within a very small structure. For example, in the vertical memory device, a channel may protrude or may be extended vertically from the surface of the substrate, and gate lines and insulation layers surrounding the vertical channel may be repeatedly stacked.

However, the reduction of the size of the vertical memory device is limited because the memory device must still include an interface to electrically connect the memory device to a peripheral circuit for communicating with, and being driven by an external device.

SUMMARY

According to an exemplary embodiment of the present inventive concept, a memory device includes a substrate, and a peripheral circuit disposed on a first surface of the substrate. The peripheral circuit includes a first transistor. The memory device further includes a first wiring layer disposed on the peripheral circuit, a base layer disposed on the first wiring layer, a memory cell array disposed on the base layer, and a second wiring layer disposed on the memory cell array. The second wiring layer includes a first power wiring configured to supply a first voltage, a second power wiring configured to supply a second voltage, and a first wiring electrically connected to the first transistor. The first wiring is configured to be electrically connectable to either the first power wiring or the second power wiring.

According to an exemplary embodiment of the present inventive concept, a memory package includes a base substrate and a plurality of memory chips stacked on the base substrate. Each of the plurality of memory chips includes a substrate and a peripheral circuit disposed on a first surface of the substrate. The peripheral circuit includes a first transistor. Each memory chip further includes a first wiring layer disposed on the peripheral circuit, a base layer disposed on the first wiring layer, a memory cell array disposed on the base layer, and a second wiring layer disposed on the memory cell array. The second wiring layer includes a first power wiring configured to supply a first voltage, a second power wiring configured to supply a second voltage, and a first wiring electrically connected to the first transistor. The first wiring configured to be electrically connectable to the first power wiring or the second power wirings. According to an exemplary embodiment of the present inventive concept, a memory device includes a substrate and a peripheral circuit disposed on a first surface of the substrate. The peripheral circuit includes a first transistor and a second transistor, a lower wiring layer disposed on the peripheral circuit, a base layer disposed on the lower wiring layer and a memory cell array disposed on the base layer. The memory cell array includes a plurality of channels. The memory device further includes an upper wiring layer disposed on the memory. The upper wiring layer includes at least two power wirings. A first power wiring of the at least two power wirings is configured to supply a first voltage and a second power wiring of the at least two power wiring is configured to supply a second voltage. The upper wiring layer further includes a first wiring electrically connected to the first transistor. The first wiring is configured to be electrically connectable to either the first or second power wirings. The upper wiring layer also includes a second wiring electrically connected to the second transistor. The second wiring is configured to be electrically connectable to either the first or second power wirings.

BRIEF DESCRIPTION OF THE DRAWINGS

The above and other features of the inventive concept will become more apparent by describing in detail exemplary embodiments thereof, with reference to the accompanying drawing, which.

DETAILED DESCRIPTION OF THE EMBODIMENTS

Exemplary embodiments of the present inventive concept will be described more fully hereinafter with reference to the accompanying drawings. The present disclosure may, however, be embodied in many different forms and should not be construed as limited to the embodiments set forth herein.

Figure 1:
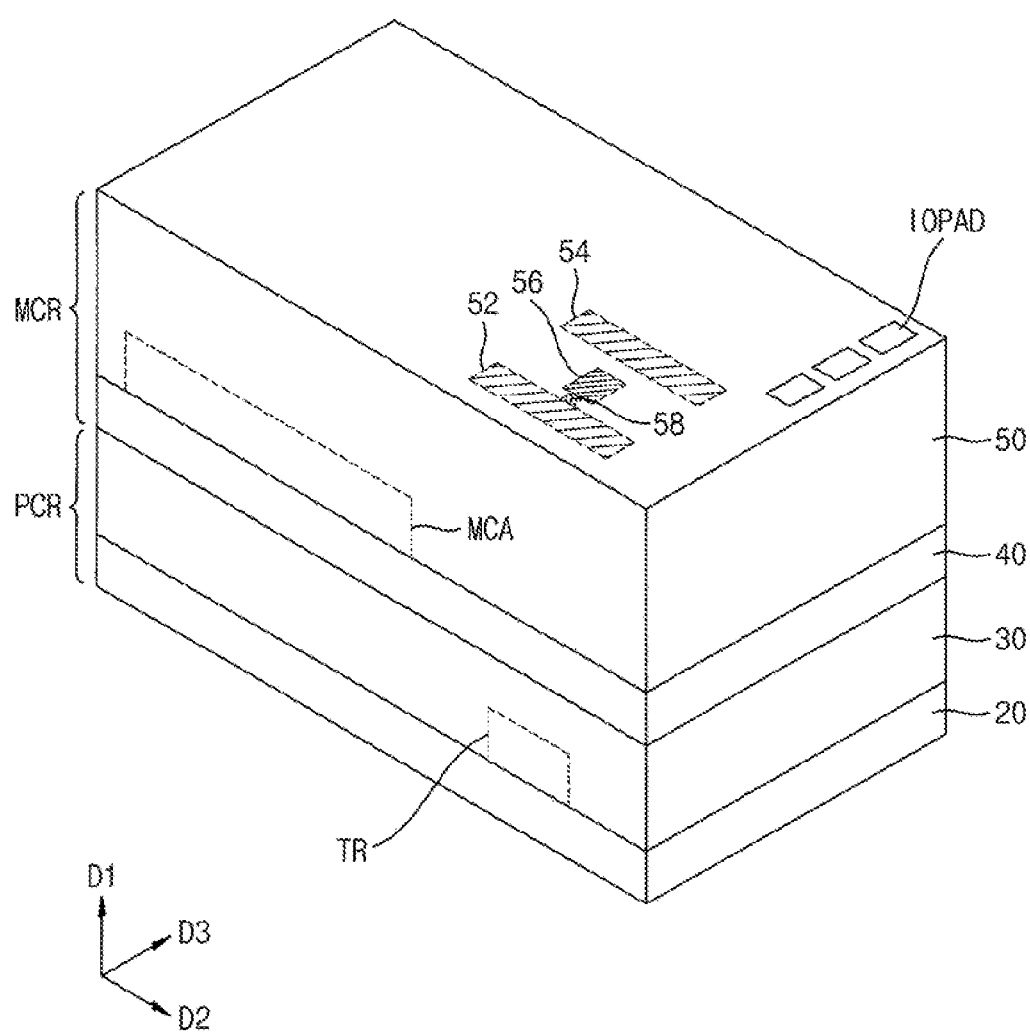
FIG. 1 is a perspective view of a memory device according to an exemplary embodiment of the present inventive concept.

It will be understood that when an element is referred to as being "connected" or "coupled" to another element, it can be directly connected or coupled to the other element or intervening elements may be present. FIG. 1 is a perspective view of a memory device according to according to an exemplary embodiment of the present inventive concept.

In FIG. 1, a direction substantially vertical to a first surface (e.g., a top surface) of a substrate is referred to as a first direction D1 (e.g., a Z-axis direction). In addition, two directions substantially parallel to the first surface of the substrate and crossing each other are referred to as a second direction D2 (e.g., an X-axis direction) and a third direction D3 (e.g., a Y-axis direction). For example, the second and third directions D2 and D3 may be substantially perpendicular to each other. In addition, the first direction D1 (e.g., a Z-axis direction) is substantially perpendicular to both the second direction D2 (e.g., an X-axis direction) and the third direction D3 (e.g., a Y-axis direction).

Referring to FIG. 1, a memory device 10 includes a peripheral circuit region PCR in which a peripheral circuit is disposed. The memory device 10 further includes a memory cell region MCR in which a memory cell array MCA is disposed. The memory device 10 may further include a plurality of input/output (I/O) pads IOPAD disposed on a top surface thereof.

The peripheral circuit region PCR includes a semiconductor substrate 20, the peripheral circuit may be on a first surface (e.g., a top surface) of the semiconductor substrate 20, and a first wiring layer 30 may be disposed on the peripheral circuit. Further, the peripheral circuit may include a first transistor TR disposed on the first surface of the semiconductor substrate 20. The memory cell region MCR includes a base layer 40 that may be disposed on the first wiring layer 30, the memory cell array MCA that may be disposed on the base layer 40, and a second wiring layer 50 that may be disposed on the memory cell array MCA. The plurality of I/O pads IOPAD may be disposed on the second wiring layer 50.

The second wiring layer 50 may include a first power wiring 52, a second power wiring 54 and a first wiring 56. The second wiring layer 50 may further include a first connection wiring 58.

The first power wiring 52 may be configured to supply a first voltage to the memory device 10, and the second power wiring 54 may be configured to supply a second voltage to the memory device 10. In addition, the second voltage may be different from the first voltage. For example, the first voltage may be a power supply voltage (e.g., Vcc), and the second voltage may be a ground voltage (e.g., Vss).

The first wiring 56 may be electrically connected to the first transistor TR. For example, as will be described with reference to FIG. 3, the first wiring 56 may be electrically connected to a gate electrode of the first transistor TR by at least one contact that is disposed through the first wiring layer 30 and the second wiring layer 50.

The first wiring 56 may be configured to be electrically connectable to one of the first and second power wirings 52 and 54. For example, as illustrated in FIG. 1, the first wiring 56 may be electrically connected to the first power wiring 52 through the first connection wiring 58. The first transistor TR may receive the first voltage. In another example, the first wiring 56 may be electrically connected to the second power wiring 54 through a second connection wiring. Further, the first transistor may then receive the second voltage.

The memory device 10 according to an exemplary embodiment of the present inventive concept may have a relatively small size by adopting the cell over periphery (COP) structure. By adopting the structure, the peripheral circuit is disposed on the semiconductor substrate 20 and the memory cell array MCA is stacked on the peripheral circuit. In addition, in the memory device 10 according to an exemplary embodiment of the present inventive concept, the wiring 56 that is electrically connected to the transistor TR in the peripheral circuit may be disposed in the second wiring layer 50 that is disposed on the memory cell array MCA. Further, the wiring 56 may be electrically connectable to the first power wiring or the second power wiring 52 and 54. Accordingly, a design of the memory device 10 may be easily modified, and thus time for manufacturing the memory device 10 may be reduced even if the design of the memory device 10 is modified.

Figure 2:
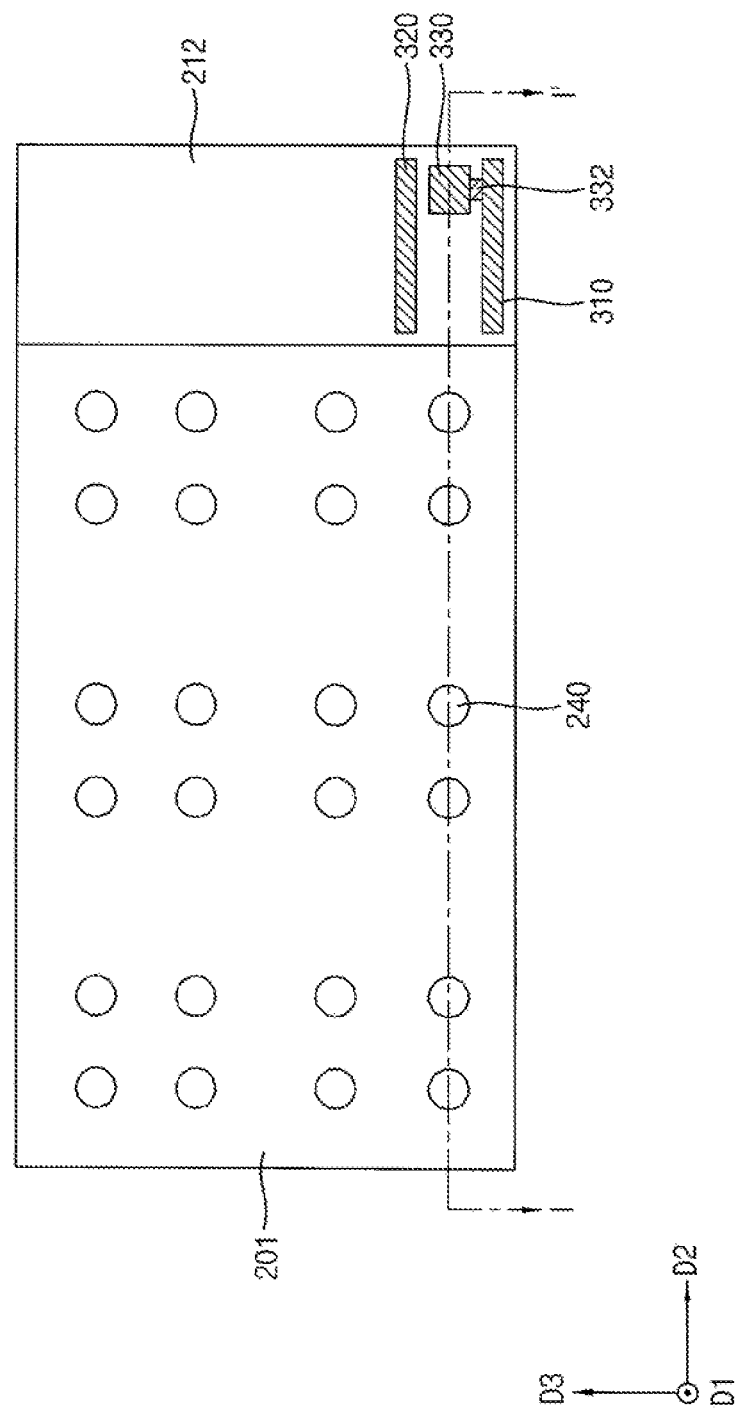
FIG. 2 is a plan view of a memory device according to an exemplary embodiment of the present inventive concept.
Figure 3:
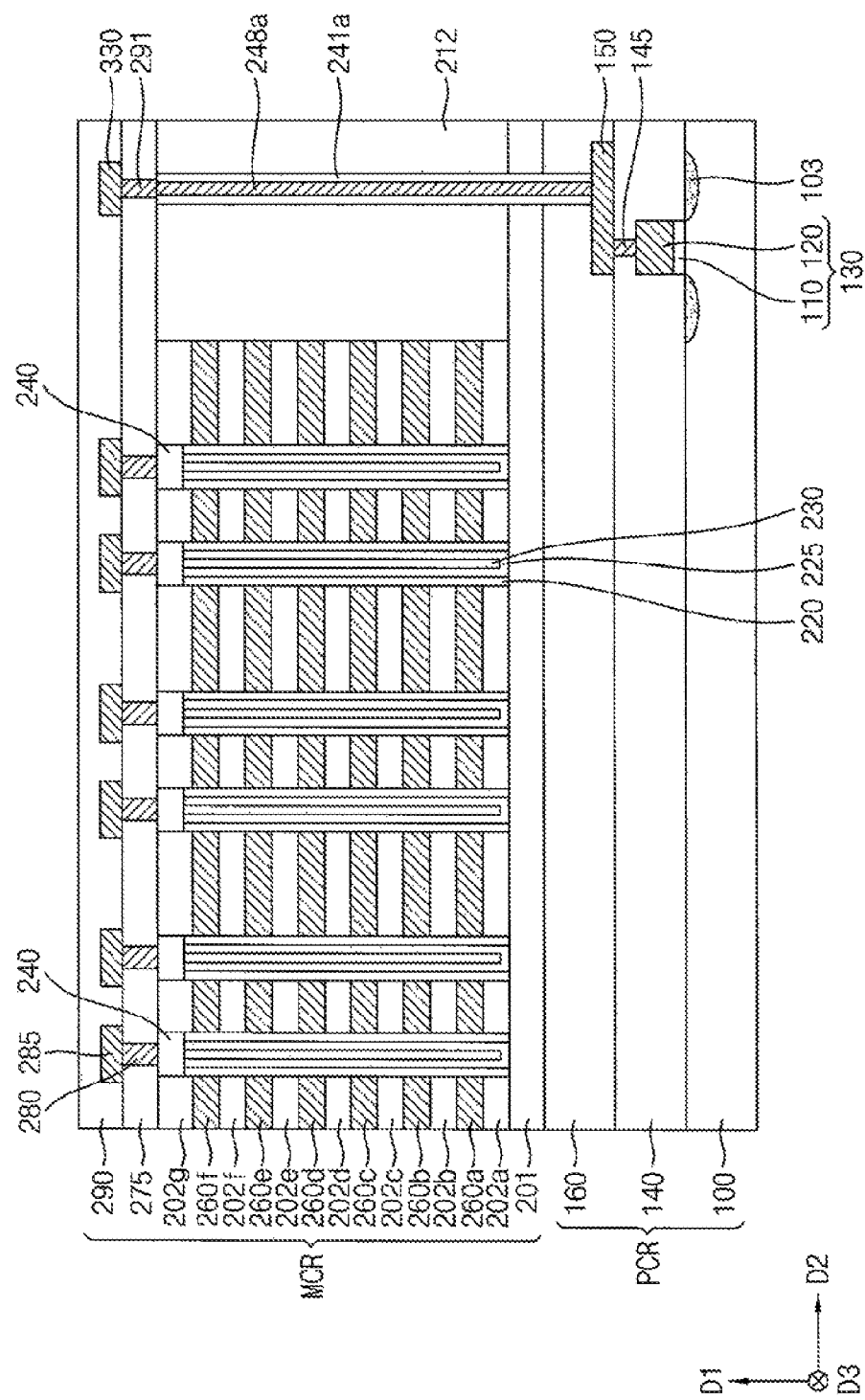
FIG. 3 is a cross-sectional view taken along lines I-I' of FIG. 2 according to an exemplary embodiment of the present inventive concept.

FIG. 2 is a plan view of a memory device according to an exemplary embodiment of the present inventive concept. FIG. 3 is a cross-sectional view taken along lines I-I' of FIG. 2 according to an exemplary embodiment of the present inventive concept.

Referring to FIGS. 2 and 3, a memory device may include a peripheral circuit region PCR including a peripheral circuit structure disposed on a substrate 100 and a memory cell region MCR including a memory cell structure disposed on the peripheral circuit structure.

In some exemplary embodiments of the present inventive concept, the memory device may be a nonvolatile memory device. For example, the nonvolatile memory device may have the COP structure in which the memory cell structure is stacked on the peripheral circuit structure. The memory cell structure may have a vertical NAND flash memory structure in which a plurality of NAND flash memory cells is disposed vertically. For example, the NAND flash cells may be stacked in the first direction D1, with respect to a first surface (e.g., a top surface) of a semiconductor substrate.

In addition, FIG. 2 illustrates a base layer 201, pads 240, a mold protection layer 212, a first power wiring 310, a second power wiring 320, a first wiring 330 and a first connection wiring 332.

The peripheral circuit structure may include, e.g., a gate structure 130 including source/drain regions 103, insulation layers 140 and 160, a contact 145, a wiring 150, etc., that may be disposed on the substrate 100. The insulation layers 140 and 160, the contact 145 and the wiring 150 may form a first wiring layer (e.g., the first wiring layer 30 in FIG. 1). Further, the first wiring layer may be referred to as a lower wiring layer. The insulation layers 140 and 160 may be referred to as lower insulation layers. The contact 145 may be referred to as a lower contact or a first contact, and the wiring 150 may be referred to as a lower wiring or the second wiring.

The substrate 100 may include a semiconductor material, e.g., crystalline silicon formed of a single crystal or a crystalline germanium formed of a single crystal. The gate structure 130 may include a gate insulation layer pattern 110 and a gate electrode 120, which are stacked on the substrate 100. Further, the gate electrode 120 is disposed on the gate insulation layer pattern 110.

The gate insulation layer pattern 110 may include, e.g., silicon oxide or a metal oxide. The gate electrode 120 may include, e.g., a metal, a metal nitride or doped polysilicon. The source/drain regions 103 may include n-type or p-type impurities. A transistor (e.g., the first transistor TR in FIG. 1) that includes the gate structure 130 and the source/drain regions 103 may be disposed on the substrate 100.

A first lower insulation layer 140 may be disposed on the substrate 100 to cover a structure that may be disposed on the substrate 100, such as the transistor. A first lower contact 145 may extend through a portion of the first lower insulation layer 140 and may be electrically connected to the gate electrode 120.

A first lower wiring 150 may be disposed on the upper surface of the first lower insulation layer 140, and may be electrically connected to the first lower contact 145. A second lower insulation layer 160 may be disposed on the first lower insulation layer 140 to cover the first lower wiring 150. Although FIG. 3 illustrates an exemplary embodiment of the present inventive concept where the lower wiring layer includes a single lower wiring 150, the lower wiring layer may include a plurality of lower wirings that are distributed in different layers, as will be described with reference to FIGS. 11 and 13.

The first and second lower insulation layers 140 and 160 may include an insulating material, e.g., silicon oxide. The first lower contact 145 and the first lower wiring 150 may include, e.g., a metal, a metal nitride or doped polysilicon.

The memory cell structure may include a base layer 201, a channel 225, gate lines 260a, 260b, 260c, 260d, 260e and 260f, a bitline 285, insulation layers 275 and 290, a contact 248a and wirings 310, 320, 330 and 332, etc., that may be disposed on the lower wiring layer (e.g., disposed on the second lower insulation layer 160). The insulation layers 275 and 290, the contact 248a and the wirings 310, 320, 330 and 332 may form a second wiring layer (e.g., the second wiring layer 50 in FIG. 1). The second wiring layer may be referred to as an upper wiring layer, the insulation layers 275 and 290 may be referred to as upper insulation layers where, for example, a second upper insulation layer 290 may be disposed on a first upper insulation layer 275. In addition, the contact 248a may be referred to as an upper contact, and the wirings 310, 320, 330 and 332 may be referred to as upper wirings.

The base layer 201 may include, for example, polysilicon or crystalline silicon formed of a single crystal. In some exemplary embodiments of the present inventive concept, the base layer 201 may further include p-type impurities such as boron (B), and in this case, the base layer 201 may serve as a p-type well.

The channel 225 may be disposed on the base layer 201, and may extend in the first direction D1 (e.g., the Z-axis direction) from a first surface (e.g., a top surface) of the base layer 201. The channel 225 may have a hollow cylindrical shape or a cup shape. The channel 225 may include polysilicon or crystalline silicon formed of a single crystal, and may include an impurity region doped with, e.g. p-type impurities such as boron.

A plurality of the channels 225 may be arranged in the second direction D2 (e.g., the X-axis direction) to form a channel row, and a plurality of the channel rows may be arranged in the third direction D3 (e.g., the Y-axis direction). In addition, the plurality of the channels 225 extends in a first direction (e.g., the Z-axis direction) that is substantially perpendicular to the first surface.

A filling layer pattern 230 may be disposed in an inner space of the channel 225. The filling layer pattern 230 may have a pillar shape or a solid cylindrical shape. The filling layer pattern 230 may include an insulation layer pattern, e.g., silicon oxide.

In some exemplary embodiments of the present inventive concept, the channel 225 may have a pillar shape or a solid cylindrical shape, and, in this case the filling layer pattern 230 may be omitted.

A dielectric layer structure 220 may be disposed on an outer sidewall of the channel 225. The dielectric layer structure 220 may have a cup shape of which a central bottom is opened, a straw shape, or a shape substantially similar to a hollow cylindrical shape.

The dielectric layer structure 220 may include, for example, a tunnel insulation layer, a charge storage layer and a blocking layer, which may be sequentially stacked from the outer sidewall of the channel 225. The blocking layer may include, for example, silicon oxide or a metal oxide, such as hafnium oxide or aluminum oxide. The charge storage layer may include, for example, a nitride, such as silicon nitride or a metal oxide, and the tunnel insulation layer may include, for example, an oxide, such as silicon oxide. For example, the dielectric layer structure 220 may have an oxide-nitride-oxide (ONO) layers stacked to form the dielectric layer structure 220.

The pad 240 may be disposed on the filling layer pattern 230, the channel 225 and the dielectric layer structure 220. For example, the filling layer pattern 230, the channel 225 and the dielectric layer structure 220 may be capped or closed by the pad 240. The pad 240 may include, for example, polysilicon or crystalline silicon formed of a single crystal. The pad 240 may further include, for example, n-type impurities, e.g., phosphorus (P) or arsenic (As).

As illustrated in FIG. 2, a plurality of the pads 240 may be arranged in the second direction D2 (e.g., the X-axis direction) to form a pad row substantially comparable to the channel row. A plurality of the pad rows may be arranged in the third direction D3 (e.g., the Y-axis direction).

The gate lines 260a-260f may be disposed on an outer sidewall of the dielectric layer structure 220 and may be spaced apart from each other in the first direction D1 (e.g., the Z-axis direction). In some exemplary embodiments of the present inventive concept, each of the gate lines 260a-260f may surround the channel 225 of at least one channel row and may be extended in the second direction D2 (e.g., the Z-axis direction). For example, as illustrated in FIGS. 2 and 3, each of the gate lines 260a-260f may surround six channel rows; however, the number of the channel rows surrounded by each of the gate lines 260a-260f is not limited thereto.

The gate lines 260a-260f may include, for example, a metal having a low electrical resistance and/or a nitride thereof. For example, the gate lines 260a-260f may include tungsten (W), tungsten nitride, titanium (Ti), titanium nitride, tantalum (Ta), tantalum nitride, platinum (Pt), or the like. In some exemplary embodiments of the present inventive concept, the gate lines 260a-260f may have a multi-layered structure including a barrier layer including a metal nitride and a metal layer.

In some exemplary embodiments of the present inventive concept, a lowermost gate line 260a (e.g., first from the base layer 201) may serve as a ground selection line (GSL), and an uppermost gate line 260f (e.g., closest to a first upper insulation layer 275) may serve as a string selection line (SSL). The other gate lines 260b, 260c, 260d and 260e between the GSL and the SSL may serve as wordlines.

According exemplary embodiment of the present inventive concept, the GSL, the wordlines and the SSL may be formed in a single level, four levels and a single level, respectively. However, each number of levels of the GSL, the wordline and the SSL is not limited thereto. In some exemplary embodiments of the present inventive concept, the GSL and the SSL may be formed in two levels, respectively, and the wordline may be formed in $2^n$ levels, where n is a positive integer, for example the wordline may have 4, 8 or 16 levels. The stacked number of the gate lines 260a-260f may be determined in consideration of a circuit design and a degree of integration of the memory device.

Insulating interlayers 202a, 202b, 202c, 202d, 202e, 202f and 202g may be disposed between the gate lines 260a-260f neighboring along the first direction D1 (e.g., the Z-axis direction). The insulating inter layers 202a-202g may include a silicon oxide based material, e.g., silicon dioxide ($SiO_2$), silicon oxycarbide (SiOC) or silicon oxyfluoride (SiOF). The gate lines 260a-260f may be insulated from each other along the first direction D1 (e.g., Z-axis direction) by the insulating interlayers 202a-202g.

A first upper insulation layer 275 may be disposed on the uppermost insulating interlayer 202g, the pad 240, a first upper contact 248a and a bitline contact 280.

The bitline contact 280 may be disposed through the first upper insulation layer 275 to make contact with the pad 240. A plurality of the bitline contacts 280 may be formed to define an array similar to an arrangement of the channels 225 or the pads 240.

The bitline 285 may be disposed on the first upper insulation layer 275 and may be electrically connected to the bitline contact 280. For example, the bitline 285 may extend in the third direction D3 (e.g., the Y-axis direction) and may be electrically connected to a plurality of the bitline contacts 280.

In some exemplary embodiments of the present inventive concept, the mold protection layer 212 may be disposed on lateral portions of the base layer 201. The first upper contact 248a may extend through the mold protection layer 212, the base layer 201 and a portion of the second lower insulation layer 160 and may make contact with the first lower wiring 150. A first insulation layer pattern 241a may be disposed on a sidewall of the first upper contact 248a.

A first plug 291 may extend through the first upper insulation layer 275 and may be in contact with the first upper contact 248a. The first upper wiring 330 may be disposed on the first upper insulation layer 275 (e.g., an upper surface of the first upper insulation layer 275) and may electrically connect the first plug 291 and the first upper contact 248a, respectively. A second upper insulation layer 290 may be disposed on the first upper insulation layer 275 and may cover the first upper wiring 330.

In the memory device according to an exemplary embodiment of the present inventive concept, the first transistor included in the peripheral circuit region PCR may be used for implementing a logic circuit. For example, the peripheral circuit region PCR may include various elements for driving the memory device. Further, each element may include various logic circuits such as an OR gate, an AND gate, a NOR gate, a NAND gate, etc., and each logic circuit may include at least one transistor. For example, the first transistor may be included in a first logic circuit and may be connected to a first input terminal of the first logic circuit. The first transistor may be electrically connected to the first upper wiring 330 through the contacts 145 and 248a, the first lower wiring 150 and the first plug 291.

In some exemplary embodiments of the present inventive concept, the first power wiring 310, the second power wiring 320, the first upper wiring 330 and the first connection wiring 332 may be disposed on the same layer on the first upper insulation layer 275 (e.g., disposed on a same plane in a plan view). For example, the first and second power wirings 310 and 320 may be disposed on the same layer that is on the memory cell array. For example, each of the first and second power wirings 310 and 320 may extend in the second direction D2 (e.g., the X-axis direction). In addition, the first and second power wirings 310 and 320 may be spaced apart from each other. The first upper wiring 330 may be arranged between the first and second power wirings 310 and 320. The first connection wiring 332 may electrically connect the first power wiring 310 with the first upper wiring 330. Further, the first connection wiring 332 may be substituted with a second connection wiring that connects the second power wiring 320 with the first upper wiring 330.

As such, in the memory device according to exemplary embodiments of the present inventive concept, the first upper wiring 330 that is electrically connected to the first transistor in the peripheral circuit may be disposed in the upper wiring layer (e.g., the second wiring layer 50 in FIG. 1). Then, the power option for the first transistor may be efficiently and easily selected based on the first upper wiring 330, by changing arrangements of the connection wiring that connects the first upper wiring 330 with one of the power wirings 310 and 320. For example, the first upper wiring 330 may be electrically connectable to one of the power wirings 310 and 320, and one of the first voltage (e.g., the power supply voltage) and the second voltage (e.g., the ground voltage) may be selected to be provided to the first transistor without an excessive design change. Accordingly, a design of the memory device may be easily modified, and thus time for manufacturing the memory device may be reduced even if the design of the memory device is modified.

Figure 4:
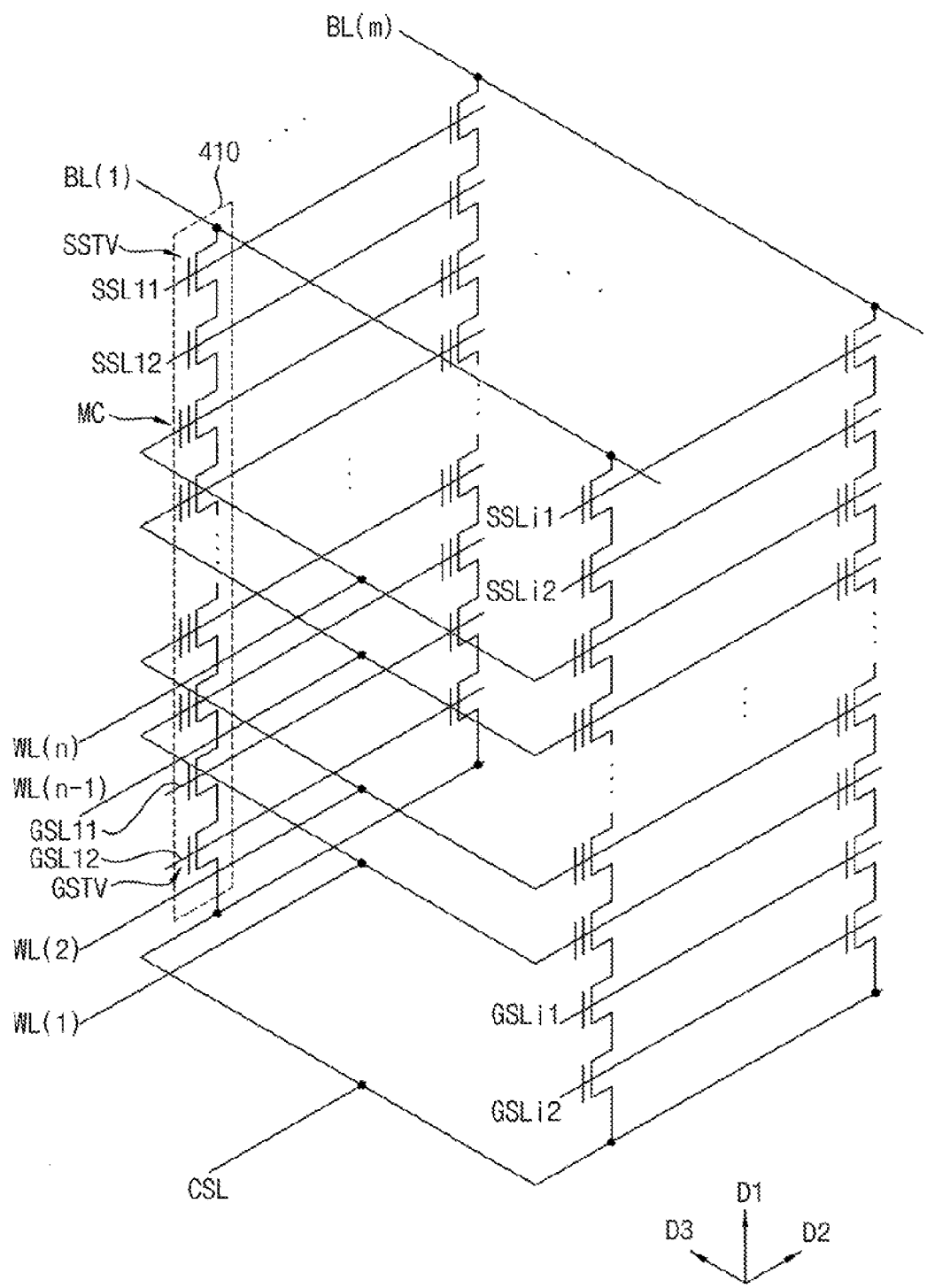
FIG. 4 is a circuit diagram illustrating an example of a memory cell array that may be disposed in a memory cell region in FIG. 3 according to an exemplary embodiment of the present inventive concept.

FIG. 4 is a circuit diagram illustrating an example of a memory cell array that may be disposed in a memory cell region in FIG. 3 according to an exemplary embodiment of the present inventive concept.

Referring to FIG. 4, a memory cell array 400 may include a plurality of strings 410 each of which has a vertical structure. The plurality of strings 410 may be arranged in the second direction D2 (e.g., the X-axis direction) to define a string column. Further, a plurality of string columns may be arranged in the third direction D3 (e.g., the Y-axis direction) to define a string array. Each string may include string selection transistors SSTV, ground selection transistors GSTV, and a plurality of memory cells MC that are arranged in the first direction D1 (e.g., the Z-axis direction) and are connected in series between the string selection transistors SSTV and the ground selection transistors GSTV.

The string selection transistors SSTV may be connected to bitlines BL(1), . . . , BL(m), and the ground selection transistors GSTV may be connected to a common source line CSL. The string selection transistors SSTV may be connected to string selection lines SSL11, SSL12, . . . , SSLi1, SSLi2, and the ground selection transistors GSTV may be connected to ground selection lines GSL11, GSL12, . . . , GSLi1, GSLi2. The memory cells in the same layer may be connected to the same wordline among wordlines WL(1), WL(2), . . . WL(n−1), WL(n). Each string selection line and each ground selection line may extend in the second direction D2 (e.g., the X-axis direction), and the string selection lines SSL11-SSLi2 and the ground selection lines GSL11-GSLi2 may be arranged along the third direction D3 (e.g., the Y-axis direction). Each wordline may extend in the second direction D2 (e.g., the X-axis direction), and the wordlines WL(1)-WL(n) may be arranged along the first direction D1 (e.g., the Z-axis direction) and the third direction D3 (e.g., the Y-axis direction). Each bitline (e.g., BL(1)) may extend in the third direction D3 (e.g., the Y-axis direction), and the bitlines BL(1)-BL(m) may be arranged along the second direction D2 (e.g., the X-axis direction). The memory cells MC may be controlled by a voltage on the wordlines WL(1)-WL(n).

As with the two-dimensional (2D) flash memory device, the vertical or three-dimensional (3D) flash memory device including the memory cell array 400 may perform a program operation and a read operation in units of a page, and an erase operation in units of a block.

Further, according to an exemplary embodiment of the present inventive concept, two string selection transistors included in a single string may be connected to a single string selection line, and two ground selection transistors included in the single string may be connected to a single ground selection line. According to an exemplary embodiment of the present inventive concept, the single string may include one string selection transistor and one ground selection transistor.

FIGS. 5, 6, 7, 8 and 9 are cross-sectional views for describing processes of manufacturing a memory device according to exemplary embodiments of the present inventive concept.

Figure 5:
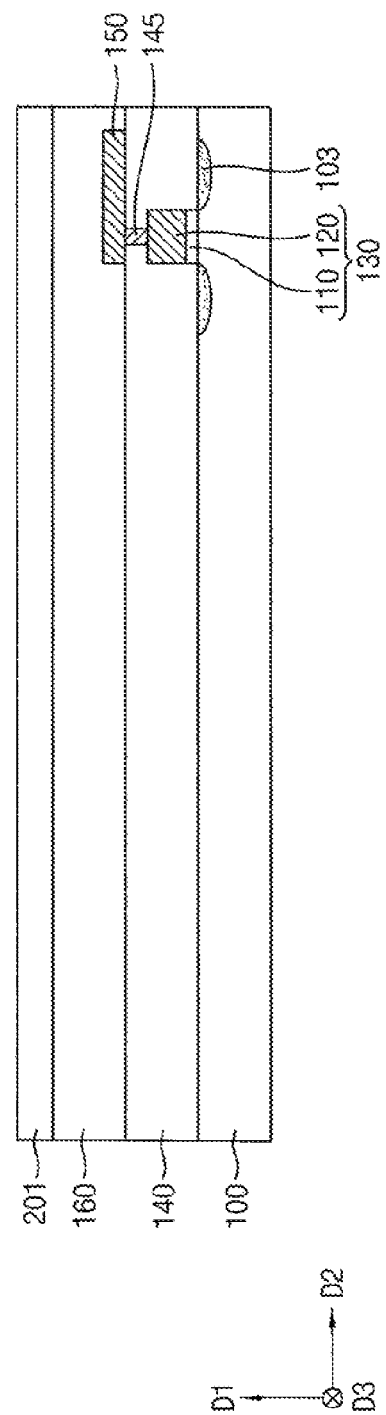
FIGS. 5, 6, 7, 8 and 9 are cross-sectional views for describing processes of manufacturing a memory device according to an exemplary embodiment of the present inventive concept.

Referring to FIG. 5, a gate structure 130 and source/drain regions 103 may be disposed on a substrate 100.

A semiconductor substrate including crystalline silicon formed of a single crystal and/or crystalline germanium formed of a single crystal may be used as the substrate 100. For example, the substrate 100 may be obtained from a silicon wafer.

A gate insulation layer and a gate electrode layer may be disposed on the substrate 100, and then may be etched to form a gate insulation layer pattern 110 and a gate electrode 120. Thus, the gate structure 130 including the gate insulation layer pattern 110 and the gate electrode 120 sequentially stacked on the substrate 100 may be formed.

An ion-implantation process may be performed using the gate structure 130 as an implantation mask to form the source/drain regions 103 at upper portions of the substrate 100 (e.g., the upper surface of the substrate 100) adjacent to the gate structure 130. Accordingly, the source/drain regions 103 may be disposed at the upper portions of the substrate 100 adjacent to the gate structure 130. Thus, the first transistor may be defined and disposed on the substrate 100.

The gate insulation layer may be formed of silicon oxide or a metal oxide by, for example, a chemical vapor deposition (CVD) process, a plasma enhanced chemical vapor deposition (PECVD) process, a spin coating process, an atomic layer deposition (ALD) process, etc. In addition, the gate insulation layer may be formed by a thermal oxidation process on a top surface of the substrate 100. The gate electrode layer may include a metal, a metal nitride or doped polysilicon by, e.g., an ALD process or a sputtering process.

A first lower insulation layer 140 covering the gate structure 130 may be disposed on the substrate 100. A first lower contact 145 may be disposed through the first lower insulation layer 140 and may be in contact with a transistor by contacting the gate electrode 120 included in the gate structure 130. Further, the first lower contact 145 may be in contact with the source/drain regions 103.

A first lower wiring 150 electrically connected to the lower contact 145 may be disposed on the first lower insulation layer 140. A second lower insulation layer 160 covering the first lower wirings 150 may be disposed on the first lower insulation layer 140.

The first and second lower insulation layers 140 and 160 may include an insulating material, e.g., silicon oxide by, e.g., a CVD process or a spin coating process. The first lower contact 145 and the first lower wiring 150 may include a metal or a metal nitride by, e.g., an ALD process or a sputtering process.

A single-leveled lower wiring is illustrated in FIG. 5; however, additional lower insulation layers and lower wirings may be stacked, as will be described with reference to FIGS. 11 and 13.

A base layer 201 may be disposed on the second lower insulation layer 160.

In an exemplary embodiment of the present inventive concept, the base layer 201 may include a polysilicon material and may be made by a sputtering process, a CVD process, an ALD process, a physical vapor deposition (PVD) process, etc. The base layer 201 may include polysilicon doped with, e.g., p-type impurities such as boron (B). Here, the base layer 201 may serve as a p-type well.

In an exemplary embodiment of the present inventive concept, an amorphous silicon layer may be disposed on the upper surface of the second lower insulation layer 160 (e.g., disposed on the second lower insulation layer 160 in the first direction D1), and then a thermal treatment or a laser irradiation may be performed to transform the amorphous silicon layer into the base layer 201 including a crystalline silicon of a single crystal. Here, defects in the base layer 201 may be substantially cured so that a functional characteristic of the base layer 201 as the p-type well may be enhanced.

In an exemplary embodiment of the present inventive concept, the base layer 201 may be formed by a wafer bonding process. Here, a wafer (e.g., a crystalline silicon formed of a single crystal wafer) may be attached on the second lower insulation layer 160. An upper portion of the wafer may be removed or planarized to form the base layer 201.

Figure 6:
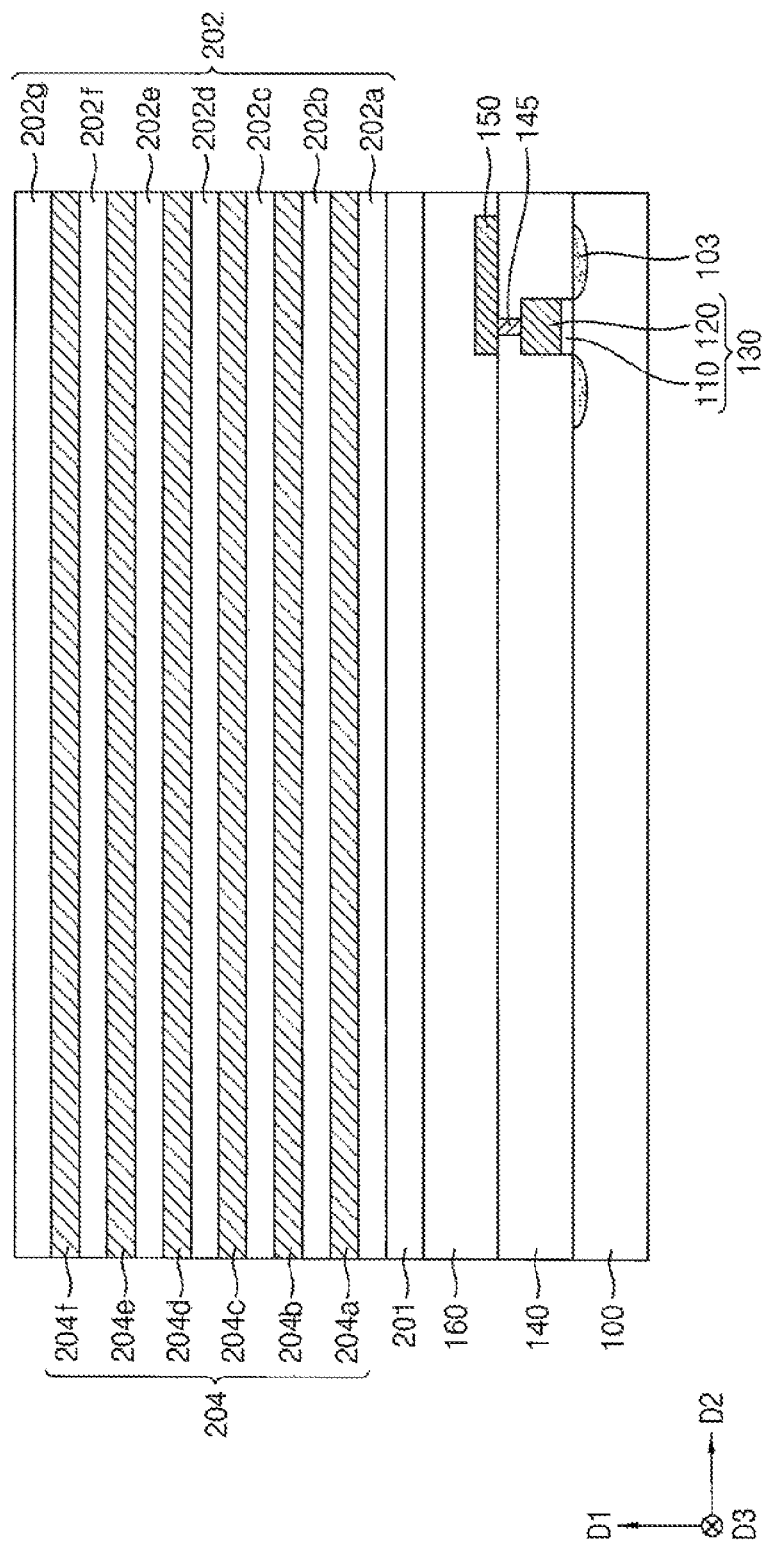

Referring to FIG. 6, insulating interlayers 202 (e.g., 202a-202g) and sacrificial layers 204 (e.g., 204a-204f) may be disposed alternately and repeatedly on the base layer 201 in a first direction D1 (e.g., the Z-axis direction) to form a mold structure. For example, a first insulating interlayer 202a may be disposed on the base layer 201, a first sacrificial layer 204a may be disposed on the first insulating layer 202a, a second insulating interlayer 202b may be disposed on the first sacrificial layer 204a, etc.

In an exemplary embodiment of the present inventive concept, the insulating interlayer 202 may include a silicon oxide based material, e.g., silicon dioxide, silicon oxycarbide and/or silicon oxyfluoride. The sacrificial layer 204 may include a material that may have an etching selectivity with respect to the insulating interlayer 202 and may be easily removed by a wet etching process. For example, the sacrificial layer 204 may include a silicon nitride (SiN) and/or silicon boronitride (SiBN).

The insulating interlayer 202 and the sacrificial layer 204 may be formed by a CVD process, a PECVD process, a spin coating process, an ALD process, etc.

The sacrificial layers 204 may be removed in a subsequent process to provide spaces for a GSL, wordlines and an SSL. For example, each of the GSL and the SSL may be formed in a single level, and the wordlines may be formed in 4 levels. In this example, the sacrificial layers 204 may be formed in 6 levels, and the insulating interlayers 202 may be formed in 7 levels as illustrated in FIG. 6. However, the stacked number of the GSL, the SSL and the wordlines might not be limited to the examples provided herein.

Figure 7:
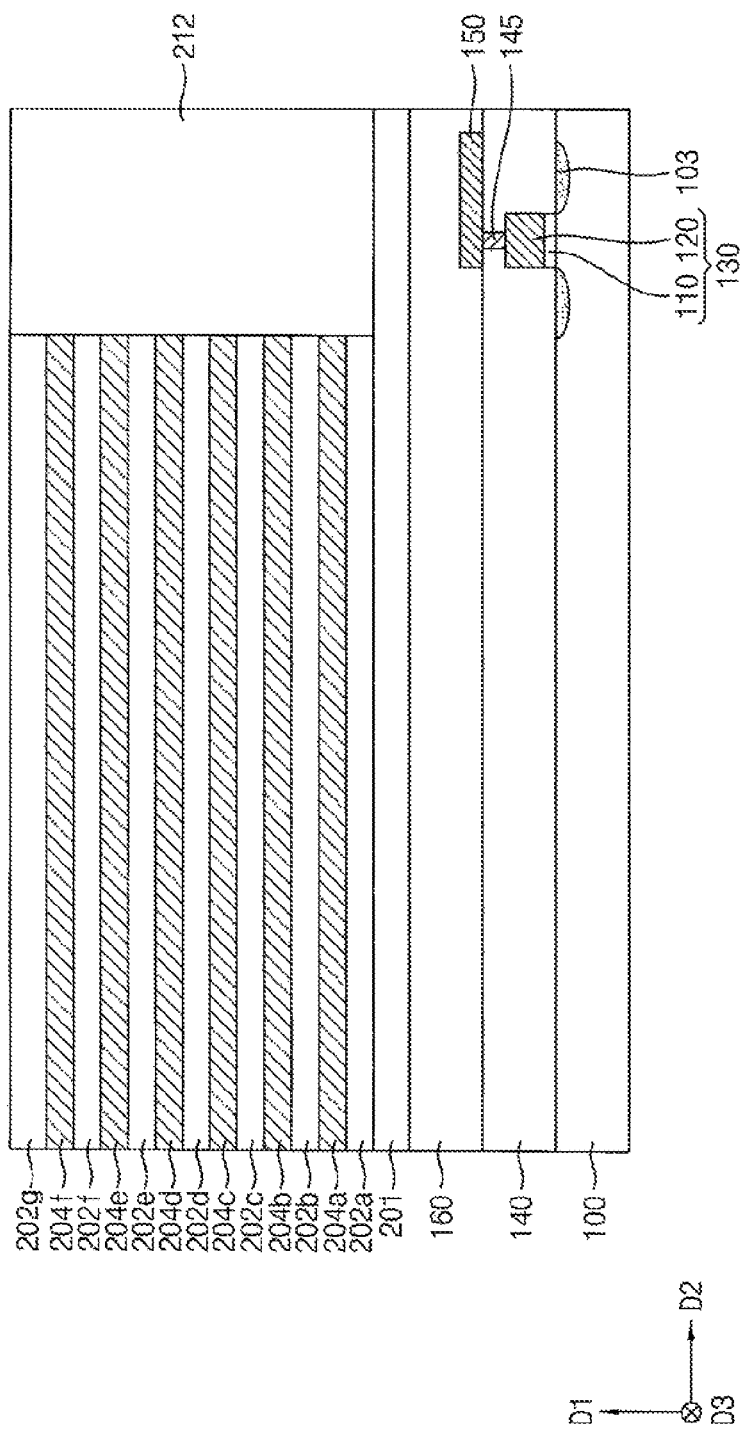

Referring to FIG. 7, a lateral portion of the mold structure may be removed, and an insulation layer covering the mold structure may be disposed on the base layer 201. In addition, to form a mold protection layer 212, an upper portion of the insulation layer may be planarized until an uppermost insulating interlayer 202g is exposed.

Figure 8:
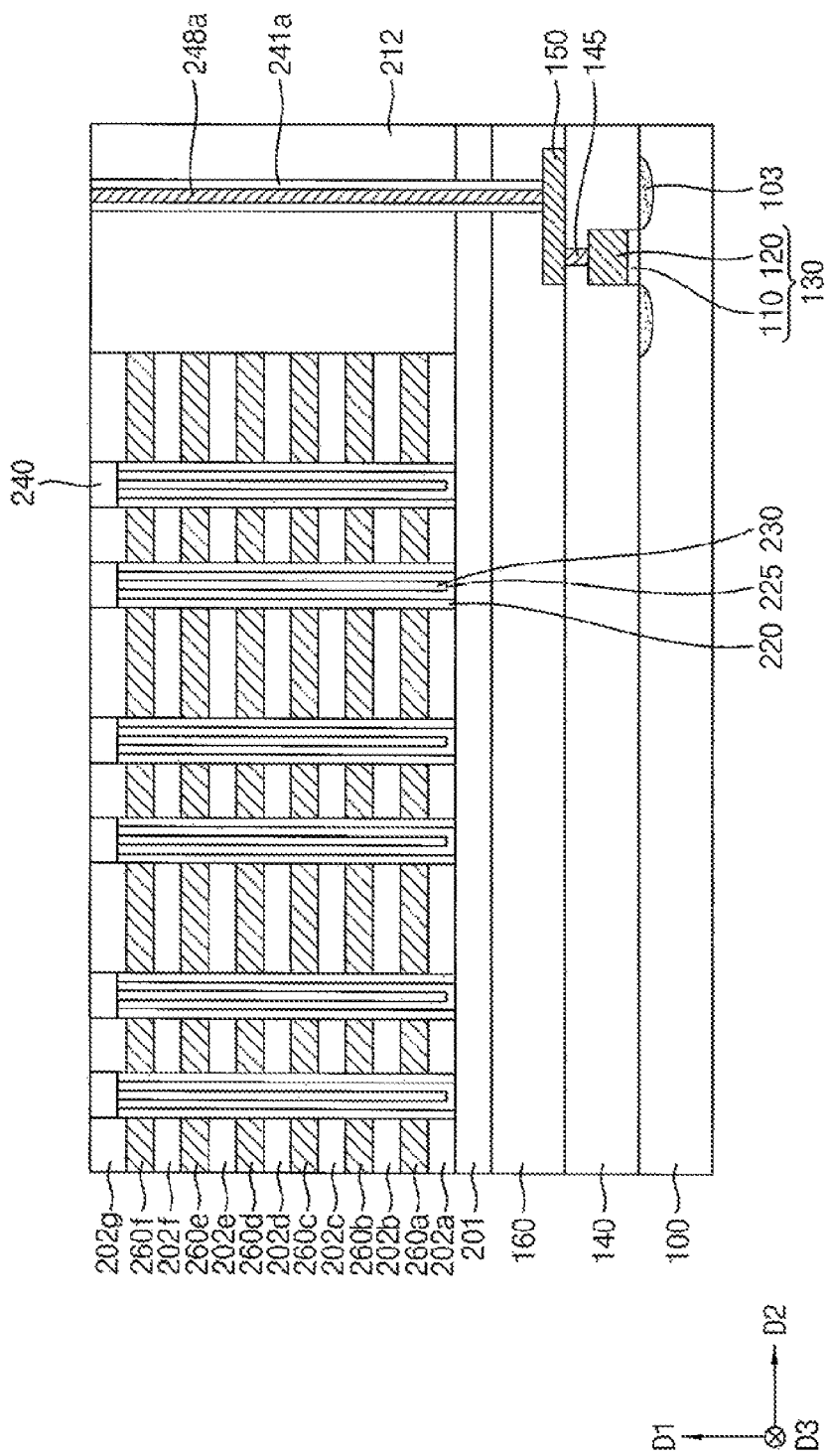

Referring to FIG. 8, channel holes may be disposed through the mold structure, and a dielectric layer structure 220, a channel 225 and a filling layer pattern 230 may be disposed in each channel hole. A pad 240 capping the channel hole may be disposed on the dielectric layer structure 220, the channel 225 and the filling layer pattern 230.

A first upper contact 248a may be formed. For example, the mold protection layer 212, the base layer 201 and a portion of the second lower insulation layer 160 may be etched to form a first contact hole through which a top surface of the first lower wiring 150 is exposed. A first insulation layer pattern 241a may be disposed on a sidewall of the first contact hole. Then, the first upper contact 248a may be formed to fill a remaining portion of the first contact hole.

An upper gate line cut region (e.g., an element 250 in FIG. 15) and a gate line cut region (e.g., an element 256 in FIG. 15) may be formed. The sacrificial layers 204 exposed by the gate line cut region may be removed, and gate lines 260a-260f may be disposed at spaces from which the sacrificial layers 204 are removed.

Figure 9:
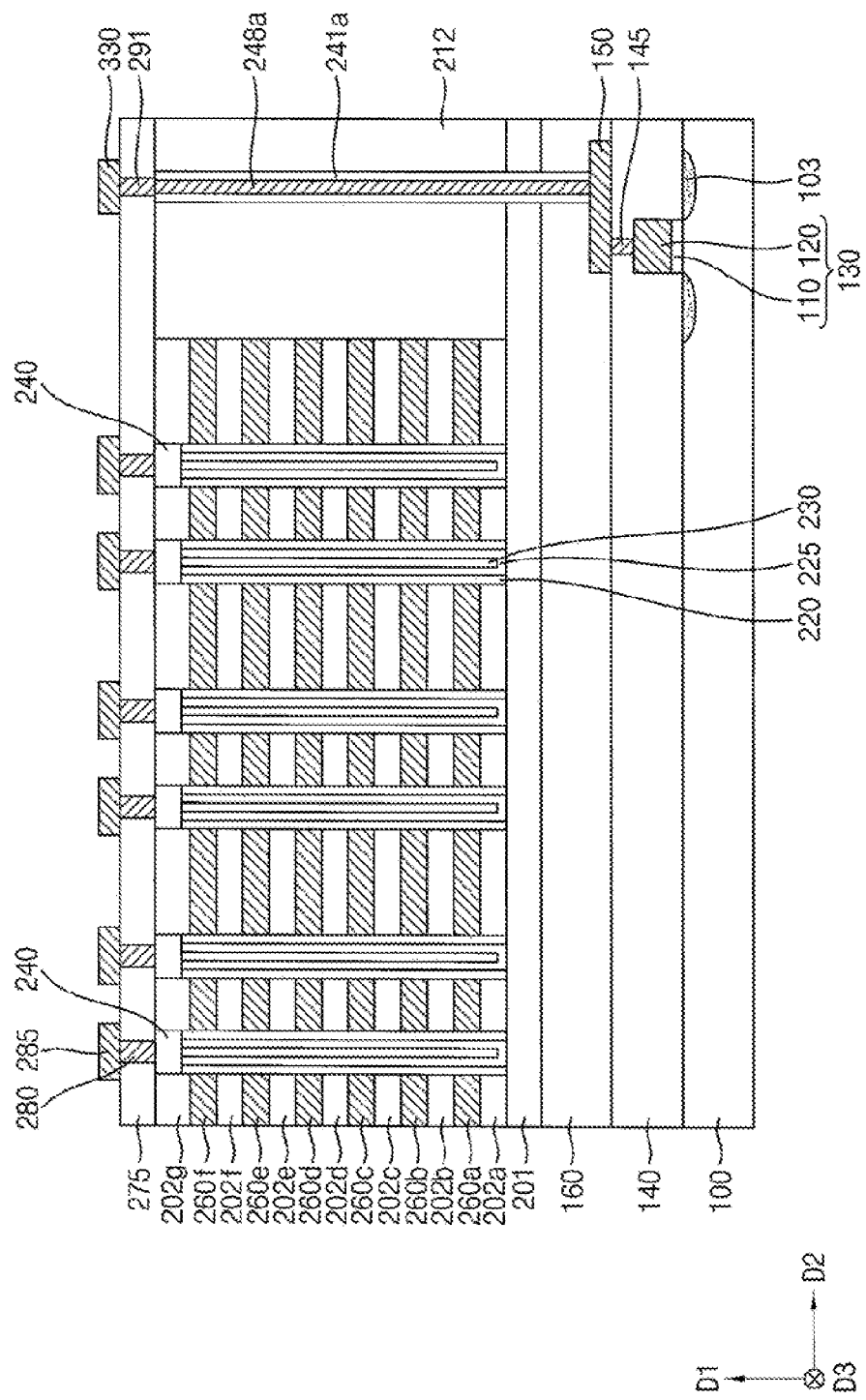

Referring to FIG. 9, a first upper insulation layer 275 may be disposed on the uppermost insulating interlayer 202g, the pad 240 and the first upper contact 248a. The first upper insulation layer 275 may be disposed of, e.g., a silicon oxide by a CVD process.

A first plug 291 and a bitline contact 280 may be disposed through the first upper insulation layer 275 and may be in contact with the first upper contact 248a and the pad 240, respectively.

A bitline 285 may be disposed on the first upper insulation layer 275 and may be electrically connected to the bitline contact 280. The bitline 285 may be extended in the third direction D3 (e.g., the Y-axis direction) and may be electrically connected to a plurality of the bitline contacts 280.

A first upper wiring 330 may be electrically connected to the first plug 291. In addition, the first upper wiring 330 may be disposed on the first upper insulation layer 275. A first power wiring 310, a second power wiring 320 and a first connection wiring 332 may also be disposed on the first upper insulation layer 275. The first upper wiring 330 may be electrically connectable to one of the first and second power wirings 310 and 320. The first transistor including the gate structure 130 and the source/drain regions 103 may receive one of the first and second voltages (e.g., one of the power supply voltage and the ground voltage) through the first upper wiring 330 (e.g., one of the first power wiring 310 and the second power wiring 320, respectively).

For example, an upper conductive layer may be disposed on the first upper insulation layer 275 using a metal or a metal nitride, and then may be patterned to form the bitline 285 and the wirings 310, 320, 330 and 332. The bitline 285 and the wirings 310, 320, 330 and 332 may be disposed by substantially the same etching process.

A second upper insulation layer 290 covering the bitline 285 and the wirings 310, 320, 330 and 332 may be disposed on the first upper insulation layer 275.

FIGS. 5, 6, 7, 8 and 9 illustrate processes where the wirings 310, 320, 330 and 332 are formed after forming the memory cell array; however, the process order is not specifically limited herein. For example, the processes for the peripheral circuit region PCR may be performed, the wirings 310, 320, 330 and 332 may be formed, and then the processes for the memory cell region MCR may be performed.

Figure 10:
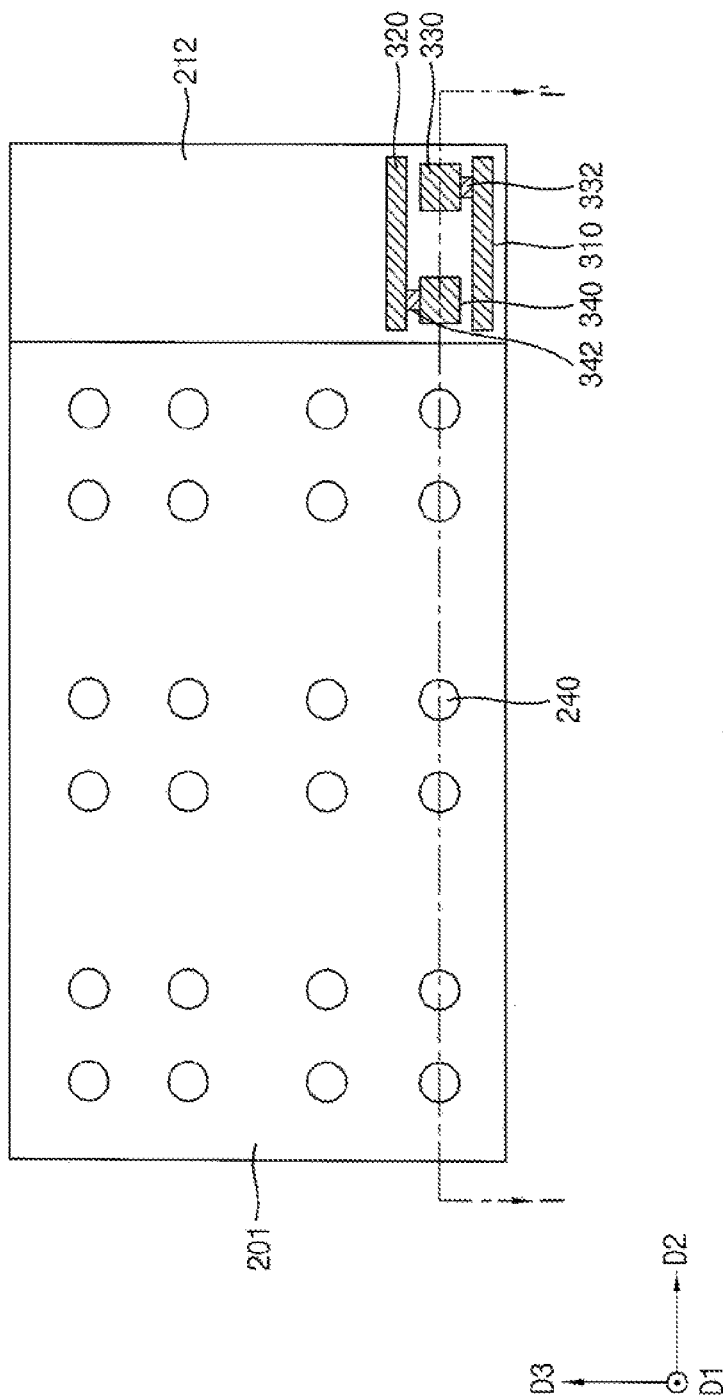
FIG. 10 is a plan view of a memory device according to an exemplary embodiment of the present inventive concept.

FIG. 10 is a plan view of a memory device according to an exemplary embodiment of the present inventive concept. FIG. 11 is a cross-sectional view taken along lines I-I' of FIG. 10 according to an exemplary embodiment of the present inventive concept.

Figure 11:
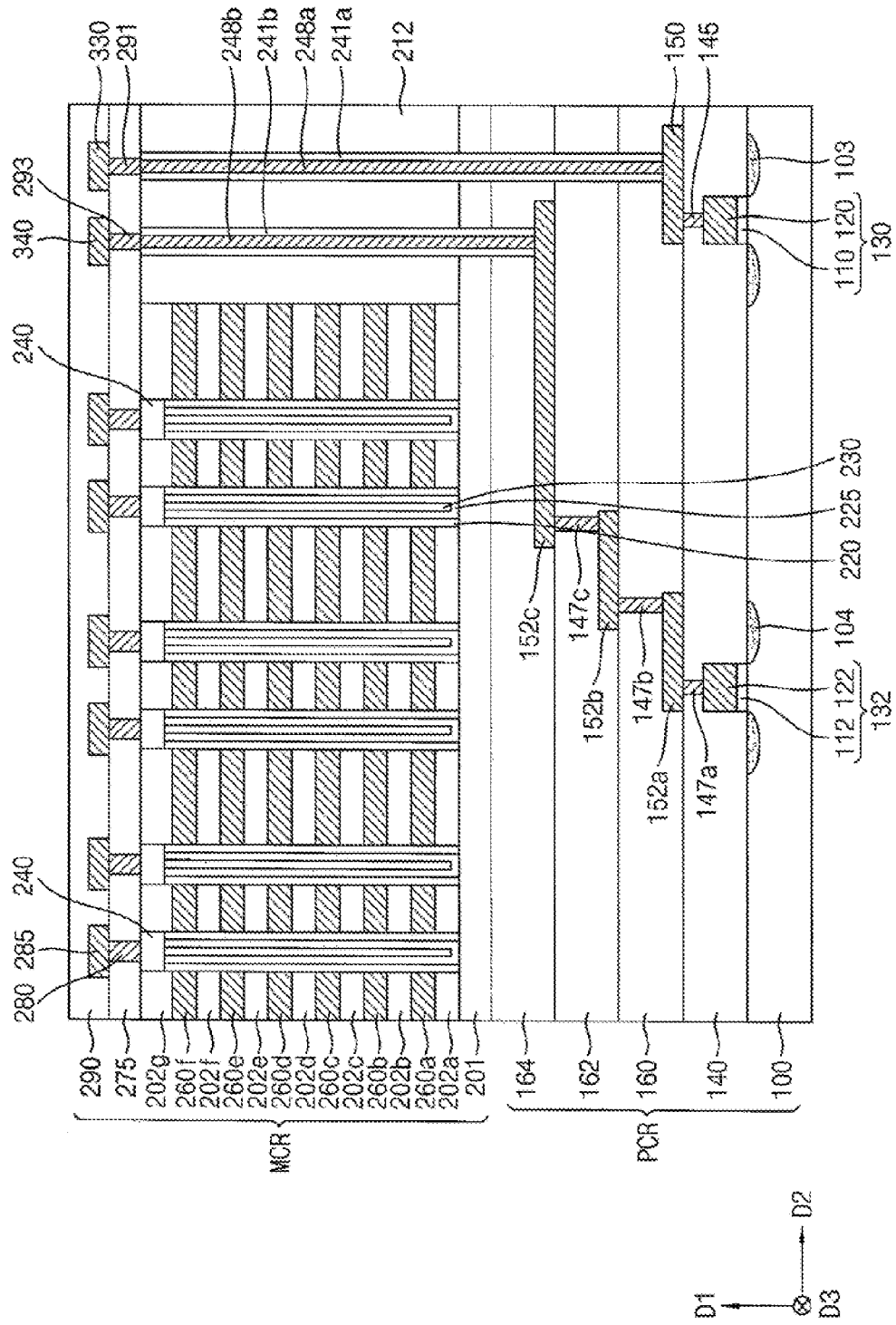
FIG. 11 is a cross-sectional view taken along lines I-I' of FIG. 10 according to an exemplary embodiment of the present inventive concept.

Referring to FIGS. 10 and 11, a memory device may include a peripheral circuit region PCR including a peripheral circuit structure disposed on a substrate 100 and a memory cell region MCR including a memory cell structure disposed on the peripheral circuit structure.

The memory device of FIGS. 10 and 11 may be substantially the same as the memory device of FIGS. 2 and 3, except that the memory device of FIGS. 10 and 11 further includes a second transistor, a second wiring 340, a second connection wiring 342 and elements for connecting the second transistor with the second wiring 340, and a lower wiring layer (e.g., a first wiring layer 30 in FIG. 1) in the memory device of FIGS. 10 and 11 is implemented with a plurality of layers.

The peripheral circuit structure may include, e.g., gate structures 130 and 132, source/drain regions 103 and 104, insulation layers 140, 160, 162 and 164, contacts 145, 147a, 147b and 147c, wirings 150, 152a, 152b and 152c, etc., that are disposed on the substrate 100.

The gate structure 132 of a transistor (e.g., the second transistor) may include a gate insulation layer pattern 112 and a gate electrode 122, which are stacked on the substrate 100. The source/drain regions 104 may include n-type or p-type impurities. A transistor (e.g., the second transistor) that includes the gate structure 132 and the source/drain regions 104 may be disposed and defined on the substrate 100.

A first lower insulation layer 140 may be disposed on the substrate 100 to cover a structure such as the transistor (e.g., the first and second transistors). A first lower contact 145 may extend through a portion of the first lower insulation layer 140 may be electrically connected to the gate electrode 120 of the gate structure 130.

A first lower wiring 150 may be disposed on the first lower insulation layer 140, and may be electrically connected to the first lower contact 145.

A second lower insulation layer 160 may be disposed on the first lower insulation layer 140 to cover the lower wirings 150 and 152a. A third lower insulation layer 162 may be disposed on the second lower insulation layer 160 to cover the lower wiring 152b. A fourth lower insulation layer 164 may be disposed on the third lower insulation pattern 162 to cover the lower wiring 152c. The gate electrode 122 may be electrically connected to the lower wirings 152a, 152b and 152c by the lower contacts 147a, 147b and 147c, respectively. The connection between the lower wirings and the lower contacts may be varied according to routing of signal lines.

The memory cell structure may include a base layer 201, a channel 225, gate lines 260a-260f, a bitline 285, insulation layers 275 and 290, contacts 248a and 248b, and wirings 310, 320, 330, 332, 340 and 342, etc., that that may be disposed on the lower wiring layer (e.g., disposed on the fourth lower insulation layer 164).

Similar to the first upper contact 248a, a second upper contact 248b may extend through the mold protection layer 212, the base layer 201 and a portion of the fourth lower insulation layer 164. However, the difference between the contacts 248a and 248b is that the second upper contact 248b may make contact with the lower wiring 152c. A second insulation layer pattern 241b may be disposed on a sidewall of the second upper contact 248b, similar to how the first insulation layer pattern 241a may be disposed with respect to the first upper contact 248a.

Similar to the first plug 291, a second plug 293 may extend through the first upper insulation layer 275 and may be in contact with the second upper contact 248b. The second upper wiring 340 may be disposed on the first upper insulation layer 275 to electrically connect the second plug 293 and the second upper contact 248b, respectively.

The second transistor may be electrically connected to the second upper wiring 340 through the contacts 147a, 147b, 147c and 248b, the lower wirings 152a, 152b and 152c and the second plug 293.

In an exemplary embodiment of the present inventive concept, the wirings 310, 320, 330, 332, 340 and 342 may be disposed on the same layer on the first upper insulation layer 275 (e.g., disposed on a same plane in a plan view). For example, each of the first and second power wirings 310 and 320 may extend in the second direction D2 (e.g., the X-axis direction), and the first and second power wirings 310 and 320 may be spaced apart from each other. The first and second upper wirings 330 and 340 may be arranged between the first and second power wirings 310 and 320. The first connection wiring 332 may electrically connect the first power wiring 310 with the first upper wiring 330. The second connection wiring 342 may electrically connect the second power wiring 320 with the second upper wiring 340. As with the first upper wiring 330, the second upper wiring 340 may be electrically connectable to one of the power wirings 310 and 320. Then, the power option for the second transistor may be efficiently and easily selected based on the second upper wiring 340, by changing arrangements of the connection wiring that connects the second upper wiring 340 with one of the power wirings 310 and 320.

Figure 12:
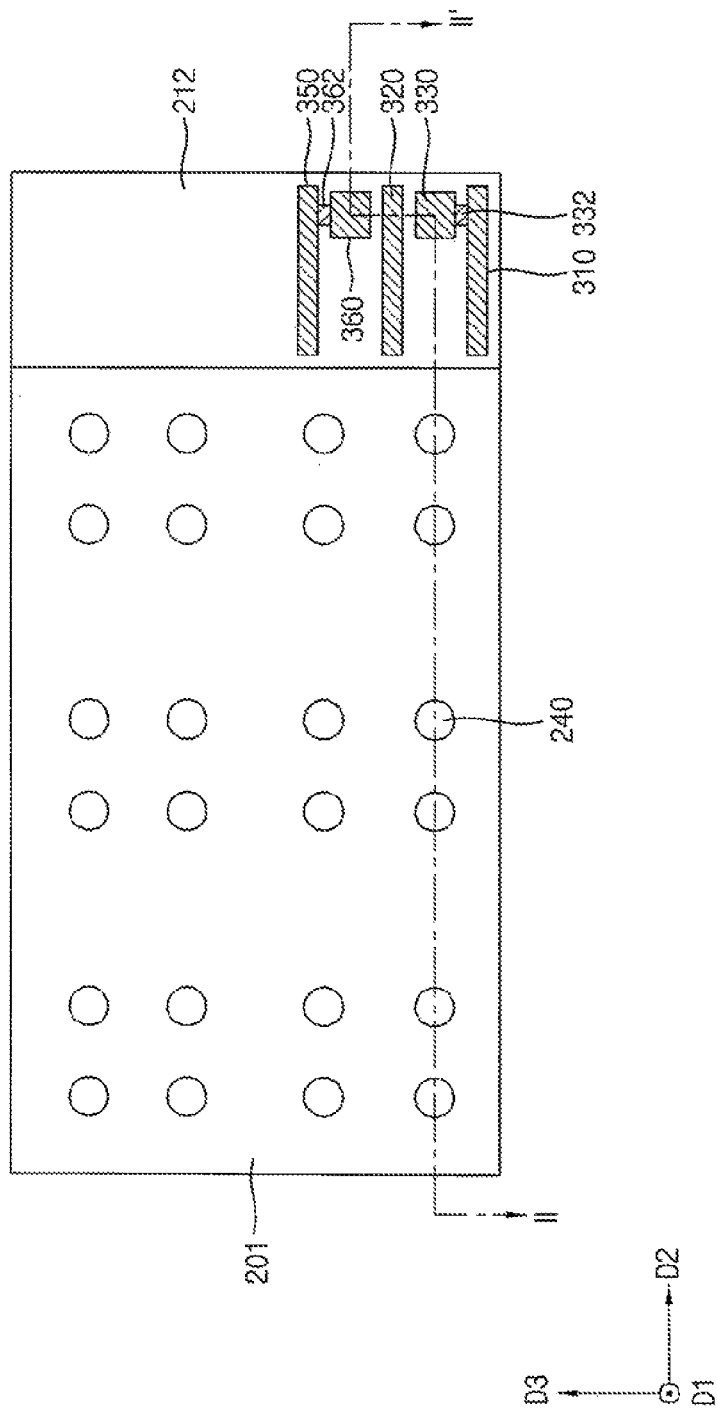
FIG. 12 is a plan view of a memory device according to an exemplary embodiment of the present inventive concept.

FIG. 12 is a plan view of a memory device according to an exemplary embodiment of the present inventive concept. FIG. 13 is a cross-sectional view taken along lines II-II' of FIG. 12 according to an exemplary embodiment of the present inventive concept.

Figure 13:
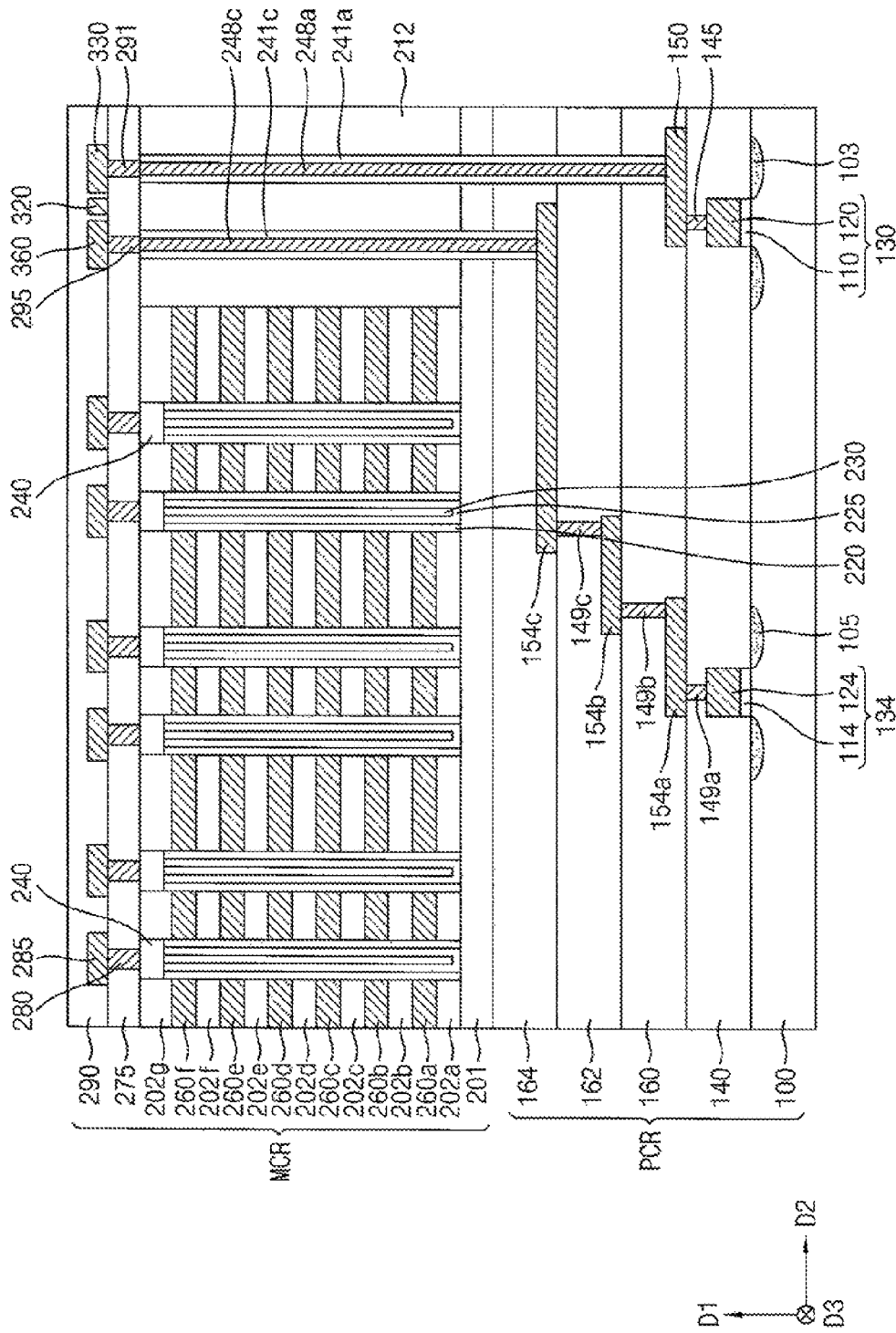
FIG. 13 is a cross-sectional view taken along lines II-II' of FIG. 12 according to an exemplary embodiment of the present inventive concept.

Referring to FIGS. 12 and 13, a memory device may include a peripheral circuit region PCR including a peripheral circuit structure disposed on a substrate 100 and a memory cell region MCR including a memory cell structure disposed on the peripheral circuit structure.

The memory device of FIGS. 12 and 13 may be substantially the same as the memory device of FIGS. 2 and 3, except that the memory device of FIGS. 12 and 13 further includes a third transistor, a third power wiring 350, a third wiring 360, a third connection wiring 362 and elements for connecting the third transistor with the third wiring 360, and a lower wiring layer (e.g., a first wiring layer) in the memory device of FIGS. 12 and 13 is implemented with a plurality of layers.

Similar to the first power wiring 310, the third power wiring 350 may supply a first voltage which may be a power supply voltage.

The peripheral circuit structure may include, e.g., gate structures 130 and 134, source/drain regions 103 and 105, insulation layers 140, 160, 162 and 164, contacts 145, 149a, 149b and 149c, wirings 150, 154a, 154b and 154c, etc., that may be disposed on the substrate 100.

The gate structure 134 of a transistor (e.g., the third transistor) may include a gate insulation layer pattern 114 and a gate electrode 124, which are stacked on the substrate 100. The source/drain regions 105 may include n-type or p-type impurities. A transistor (e.g., the third transistor) that includes the gate structure 134 and the source/drain regions 105 may be disposed and defined on the substrate 100.

A first lower insulation layer 140 may be disposed on the substrate 100 to cover a structure such as the transistor (e.g., the third transistor). A first lower contact 145 may extend through a portion of the first lower insulation layer 140 may be electrically connected to the gate electrode 120 of the gate structure 130.

A first lower wiring 150 may be disposed on the first lower insulation layer 140, and may be electrically connected to the first lower contact 145.

A second lower insulation layer 160 may be disposed on the first lower insulation layer 140 to cover the lower wirings 150 and 154a. A third lower insulation layer 162 may be disposed on the second lower insulation layer 160 to cover the lower wiring 154b. A fourth lower insulation layer 164 may be disposed on the third lower insulation pattern 162 to cover the lower wiring 154c. The gate electrode 124 may be electrically connected to the lower wirings 154a, 154b and 154c by the lower contacts 149a, 149b and 149c, respectively. The connection between the lower wirings and the lower contacts may be varied according to routing of signal lines.

The memory cell structure may include a base layer 201, a channel 225, gate lines 260a-260f, a bitline 285, insulation layers 275 and 290, contacts 248a and 248c, and wirings 310, 320, 330, 332, 350, 360 and 362, etc., that may be disposed on the lower wiring layer (e.g., disposed on the fourth lower insulation layer 164).

Similar to the first upper contact 248a, a third upper contact 248c may extend through the mold protection layer 212, the base layer 201 and a portion of the fourth lower insulation layer 164. However, the difference between the contacts 248a and 248c is that the second upper contact 248c may make contact with the lower wiring 154c. A third insulation layer pattern 241c may be disposed on a sidewall of the third upper contact 248c, similar to how the first insulation layer pattern 241a may be disposed with respect to the first upper contact 248a.

Similar to the first plug 291, a third plug 295 may extend through the first upper insulation layer 275 and maybe in contact with the third upper contact 248c. The third upper wiring 360 may be disposed on the first upper insulation layer 275 to electrically connect the third plug 295 and the third upper contact 248c, respectively.

The third transistor may be electrically connected to the third upper wiring 360 through the contacts 149a, 149b, 149c and 248c, the lower wirings 154a, 154b and 154c and the third plug 295.

In an exemplary embodiment of the present inventive concept, the wirings 310, 320, 330, 332, 350, 360 and 362 may be disposed on the same layer on the first upper insulation layer 275 (e.g., disposed on a same plane in a plan view). For example, each of the first, second and third power wirings 310, 320 and 350 may extend in the second direction D2 (e.g., the X-axis direction), and the first, second and third power wirings 310, 320 and 350 may be spaced apart from each other. The first upper wiring 330 may be arranged between the first and second power wirings 310 and 320. The third upper wiring 360 may be arranged between the second and third power wirings 320 and 350. The first connection wiring 332 may electrically connect the first power wiring 310 with the first upper wiring 330. The third connection wiring 362 may electrically connect the third power wiring 350 with the third upper wiring 360. As with the first upper wiring 330, the third upper wiring 360 may be electrically connectable to one of the power wirings 320 and 350. Then, the power option for the third transistor may be efficiently and easily selected based on the third upper wiring 360, by changing arrangements of the connection wiring that connects the third upper wiring 360 with one of the power wirings 320 and 350.

Although FIGS. 2, 10 and 12 illustrate examples of the upper wirings and the power wirings, the number, arrangement and configuration of the upper wirings and the power wirings are not limited thereto. Further, upper wirings and the power wirings illustrated are included in the upper wiring layer (e.g., the second wiring layer) on the memory cell array and are electrically connected to the transistors in the peripheral circuit. For example, the upper wiring layer of the memory device may include any number of power wirings that extend in any direction and are spaced apart from each other, and any number of upper wirings that are electrically connected to elements (e.g., transistors) in the peripheral circuit and may be configured to be electrically connectable to one of the power wirings.

Figure 14:
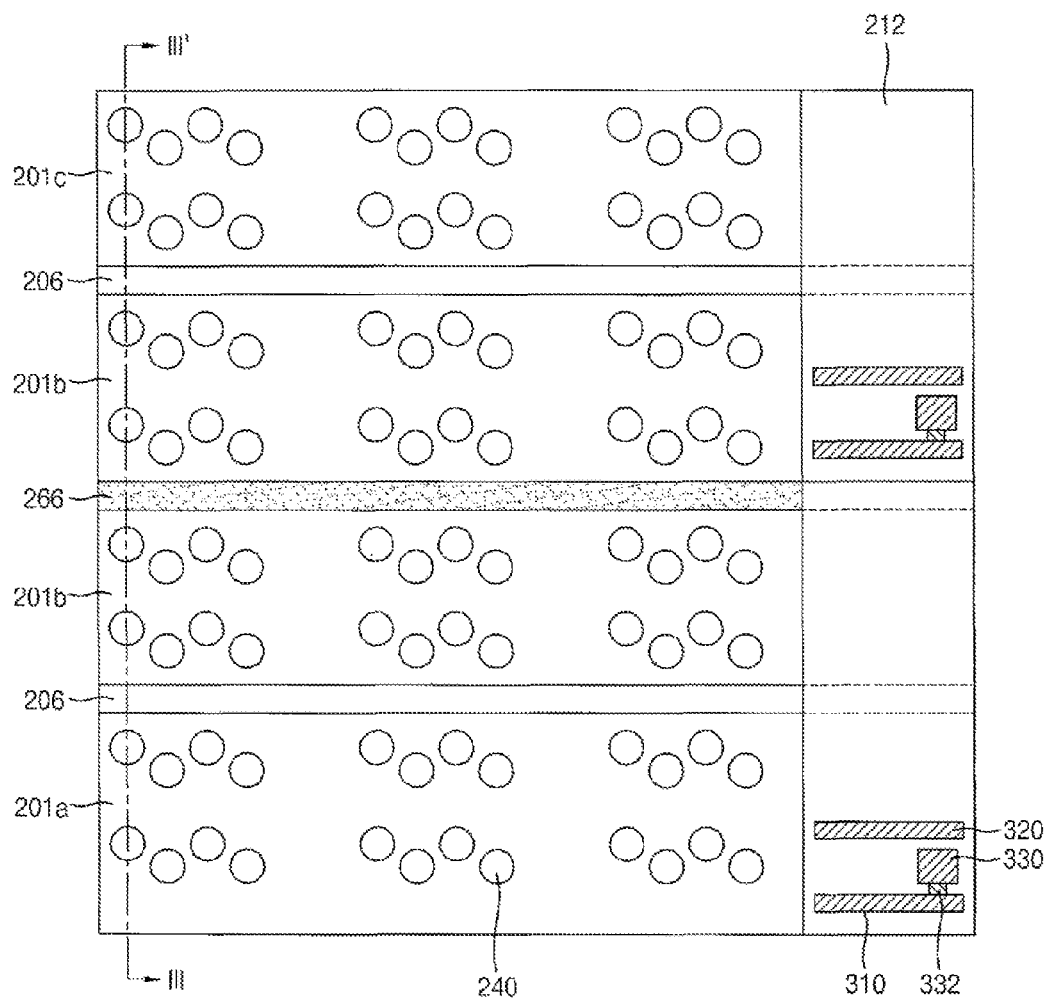
FIG. 14 is a plan view of a memory device according to an exemplary embodiment of the present inventive concept.
Figure 15:
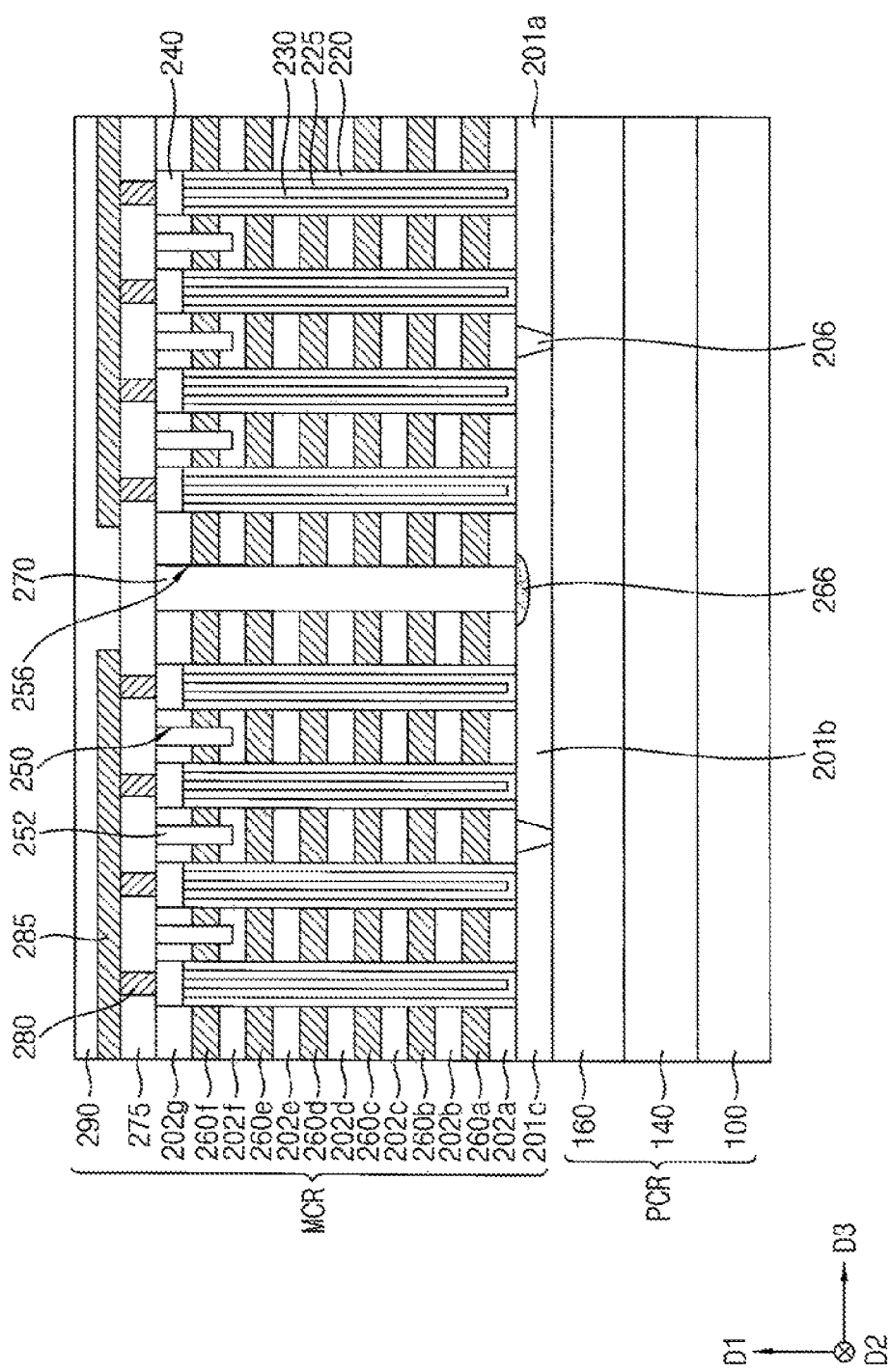
FIG. 15 is a cross-sectional view taken along lines III-III' of FIG. 14 according to an exemplary embodiment of the present inventive concept.

FIG. 14 is a plan view of a memory device according to an exemplary embodiment of the present inventive concept. FIG. 15 is a cross-sectional view taken along lines III-III' of FIG. 14 according to an exemplary embodiment of the present inventive concept.

Referring to FIGS. 14 and 15, a memory device may include a peripheral circuit region PCR including a peripheral circuit structure disposed on a substrate 100 and a memory cell region MCR including a memory cell structure disposed on the peripheral circuit structure.

The memory device of FIGS. 14 and 15 may be substantially the same as the memory device of FIGS. 2 and 3, except that a base layer in the memory device of FIGS. 14 and 15 is physically divided into a plurality of base layer patterns, and arrangements of channels 225 and pads 240 are changed in the memory device of FIGS. 14 and 15.

For clear and concise description, some elements of the memory device are not shown in FIG. 14. For example, FIG. 14 illustrates base layer patterns 201a, 201b and 201c, separation layer patterns 206, an impurity region 266, pads 240, a mold protection layer 212, a first power wiring 310, a second power wiring 320, a first wiring 330 and a first connection wiring 332, and the other elements than described above are omitted.

The memory cell structure may include the first, second and third base layer patterns 201a, 201b and 201c, the channel 225, gate lines 260a, 260b, 260c, 260d, 260e and 260f, a bitline 285, insulation layers 275 and 290, and wirings 310, 320, 330 and 332, etc., that may be disposed on the lower wiring layer (e.g., disposed on the second lower insulation layer 160).

The separation layer pattern 206 may be extended in the second direction D2 (e.g., the X-axis direction), and a plurality of the separation layer patterns 206 may be arranged along the third direction D3 (e.g., the Y-axis direction). Thus, a base layer may be physically divided into the first through third base layer patterns 201a-201c. FIGS. 14 and 15 illustrate three base layer patterns 201a-201c; however, the number of the base layer patterns is not limited thereto. The separation layer pattern 206 may include an insulation layer pattern, e.g., silicon oxide.

In an exemplary embodiment of the present inventive concept, a lowermost insulating interlayer 202a may be substantially integral or unitary with the separation layer pattern 206. In an exemplary embodiment of the present inventive concept, the formation of the separation layer may be omitted, and the lowermost insulating interlayer 202a may fill the opening corresponding to the separation layer pattern 206 and cover the base layer patterns 201a-201c.

The base layer patterns 201a-201c may include, for example, polysilicon or crystalline silicon formed of a single crystal. In an exemplary embodiment of the present inventive concept, the base layer patterns 201a-201c may further include p-type impurities such as boron (B). In this exemplary embodiment, the base layer patterns 201a-201c may serve as a p-type well.

The channel 225 may be disposed on the base layer patterns 201a-201c, and may extend in the first direction D1 (e.g., the Z-axis direction) from top surfaces of the base layer patterns 201a-201c. In an exemplary embodiment of the present inventive concept, a plurality of the channels 225 may be arranged in the second direction D2 (e.g., the X-axis direction) to form a channel row, and the channels 225 included in the neighboring channel rows may be arranged in a zigzag manner to face each other. Thus, a density of the channels 225 in a unit area of the base layer pattern 201a-201c may be increased.

A gate line cut region 256 may be disposed through the gate lines 260a-260f and the insulating interlayers 202a-202g along the first direction D1 (e.g., the Z-axis direction). The gate line cut region 256 may have a trench shape or a ditch shape extending in the second direction D2 (e.g., the X-axis direction).

A gate line cut pattern 270 extending in the second direction D2 (e.g., the X-axis direction) may be disposed on the impurity region 266. A plurality of the impurity regions 266 and a plurality of the gate line cut patterns 270 may be arranged along the third direction D3 (e.g., the Y-axis direction). In an exemplary embodiment of the present inventive concept, the impurity region 266 may include n-type impurities, for example, phosphorus (P) or arsenic (As). The gate line cut pattern 270 may include an insulation layer pattern, e.g., silicon oxide. A metal silicide pattern such as a cobalt silicide pattern and/or a nickel silicide pattern may be further disposed on the impurity region 266.

In an exemplary embodiment of the present inventive concept, one of the impurity regions 266 and one of the gate line cut patterns 270 may be provided per each of the base layer patterns 201a-201c. As illustrated in FIG. 15, for example, the gate line cut region 256 may be disposed at a central region of the second base layer pattern 201b. The impurity region 266 may be disposed in an upper portion of the second base layer pattern 201b exposed by the gate line cut region 256, and the gate line cut pattern 270 filling the gate line cut region 256 may be disposed on the impurity region 266 in the first direction D1 (e.g., the Z-axis direction).

In an exemplary embodiment of the present inventive concept, a cell block sharing the gate lines 260a-260f may be defined by the gate line cut pattern 270. The cell block may be divided into sub-cell blocks by the separation layer pattern 206. Thus, a dimension or a size of an individual block may be reduced, so that a segmented operational control may be achieved. For example, the cell block may be further segmented or divided by the separation layer pattern 206, and thus signal interference or disturbance occurring when a dimension or a size of the cell block becomes increased may be prevented. Therefore, an operational reliability of the memory device may be improved.

An upper gate line cut pattern 252 may be disposed in an upper gate line cut region 250. The upper gate line cut pattern 252 may include an insulation material, e.g., silicon oxide.

In an exemplary embodiment of the present inventive concept, the upper gate line cut region 250 or the upper gate line cut pattern 252 may be provided for a separation of the SSL in each cell block. In this exemplary embodiment of the present inventive concept, the upper gate line cut region 250 or the upper gate line cut pattern 252 may extend through an uppermost insulating interlayer 202g and a SSL 260f, and may extend partially through an insulating interlayer 202f directly under the SSL 260f.

In an exemplary embodiment of the present inventive concept, the upper wirings 310, 320, 330 and 332 may be arranged corresponding to each of the base layer patterns 201a-201c.

In an exemplary embodiment of the present inventive concept, the number, arrangement and configuration of the upper wirings and the power wirings included in the upper wiring layer (e.g., the second wiring layer 50 of FIG. 1) of the memory device of FIGS. 14 and 15 may be changed. In an exemplary embodiment of the present inventive concept, the lower wiring layer (e.g., the first wiring layer 30 in FIG. 1) of the memory device of FIGS. 14 and 15 may be implemented with a plurality of layers.

Figure 16:
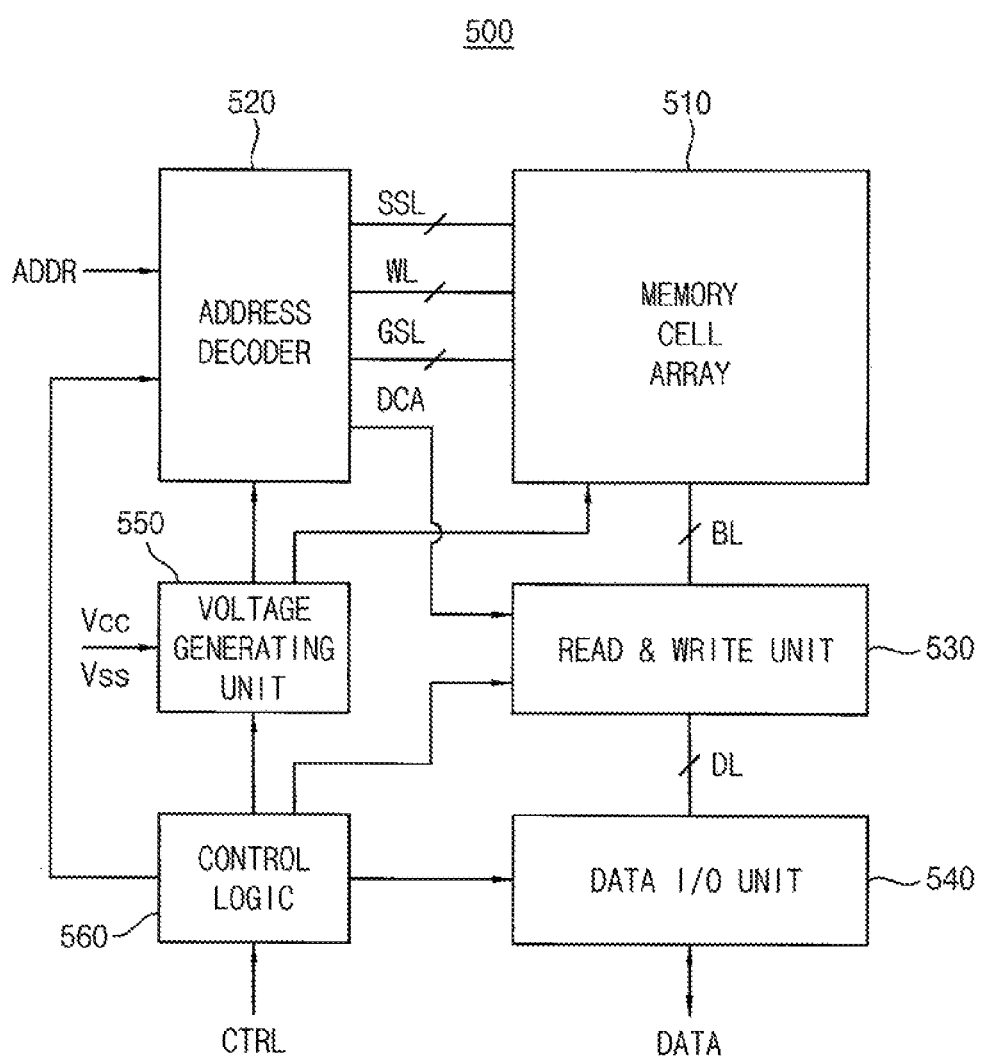
FIG. 16 is a block diagram illustrating a memory device according to an exemplary embodiment of the present inventive concept.

FIG. 16 is a block diagram illustrating a memory device according to an exemplary embodiment of the present inventive concept.

Referring to FIG. 16, a memory device 500 may include a memory cell array 510, an address decoder 520, a read and write unit 530, a data input/output (I/O) unit 540, a voltage generating unit 550, and a control logic 560.

In the memory device 500 according to an exemplary embodiment of the present inventive concept, the memory cell array 510 may be disposed in the memory cell region MCR in FIG. 1, and the other elements, for example, the address decoder 520, the read and write unit 530, the data input/output (I/O) unit 540, the voltage generating unit 550 and the control logic 560 may be disposed in the peripheral circuit region PCR in FIG. 1.

The memory cell array 510 may be connected to the address decoder 520 through wordlines WL and selection lines. For example, the selection lines may include string selection lines SSL and ground selection lines GSL. The memory cell array 510 may be connected to the read and write unit 530 through bitlines BL.

The memory cell array 510 may include a plurality of memory cells. For example, the memory cell array 510 may include memory cells disposed along row and column directions. For example, the memory cell array 510 may include a plurality of memory cells with each cell storing one or more data bits. For example, the memory cell array 510 may have a vertical NAND flash structure as illustrated in FIG. 4.

The address decoder 520 may be connected to the memory cell array 510 through the wordlines WL, the string selection lines SSL, and the ground selection lines GSL. The address decoder 520 may operate in response to a control of the control logic 560. The address decoder 520 may receive addresses ADDR from an external device such as a memory controller.

The address decoder 520 may decode a row address among the received addresses ADDR. The address decoder 520 may select at least one wordline corresponding to the decoded row address among the wordlines WL. The address decoder 520 may select at least one selection line corresponding to the decoded row address among the selection lines including the string selection lines SSL and the ground selection lines GSL.

The address decoder 520 may deliver various voltages received from the voltage generating unit 550 to the selected wordline, unselected wordlines, the selected selection line, and unselected selection lines.

The address decoder 520 may decode a column address among the received address ADDR. In addition, the address decoder 520 may deliver the decoded column address DCA to the read and write unit 530.

In an exemplary embodiment of the present inventive concept, the address decoder 520 may include a row decoder decoding a row address, a column decoder decoding a column address, and an address buffer storing a received address ADDR.

The read and write unit 530 may be connected to the memory cell array 510 through the bitlines BL, and may be connected to the data I/O unit 540 through data lines DL. The read and write unit 530 may operate in response to a control of the control logic 560. The read and write unit 530 may receive the decoded column address DCA from the address decoder 520. Based on the decoded column address DCA, the read and write unit 530 may select at least one bitline among the bitlines BL.

In an exemplary embodiment of the present inventive concept, the read and write unit 530 may receive data from the data I/O unit 540, and may write received data into the memory cell array 510. The read and write unit 530 may read data from the memory cell array 510, and may deliver the read data to the data I/O unit 540. The read and write unit 530 may read data from a first storage region of the memory cell array 510, and may write the read data in a second storage region of the memory cell array 510. For example, the read and write unit 530 may perform a copy-back operation.

In an exemplary embodiment of the present inventive concept, the read and write unit 530 may include components such as a page buffer (or page register) and a column selection circuit. In an exemplary embodiment of the present inventive concept, the read and write unit 530 may include components such as a sense amplifier, a write driver, and a column selection circuit.

The data I/O unit 540 may be connected to the read and write unit 530 through the data lines DL. The data I/O unit 540 may operate in response to a control of the control logic 560. The data I/O unit 540 may exchange data DATA with the external device. The data I/O unit 540 may deliver the data DATA from the external device to the read & write unit 530 through the data lines DL. The data I/O unit 540 may output the data DATA delivered from the read & write unit 530 through the data lines DL to the external device. In an exemplary embodiment of the present inventive concept, the data I/O unit 540 may include components such as a data buffer.

The voltage generating unit 550 is connected to the memory cell array 510, the address decoder 520, and the control logic 560. The voltage generating unit 550 may receive power from the external device. In an exemplary embodiment of the present inventive concept, the voltage generating unit 550 may receive a power supply voltage Vcc and a ground voltage Vss from the external device. Based on a control of the control logic 560, the voltage generating unit 550 may generate voltages having various levels from the power supply voltage Vcc and the ground voltage Vss. In an exemplary embodiment of the present inventive concept, the voltage generating unit 550 may generate various voltages such as a high voltage Vpp, a program voltage Vpgm, a pass voltage Vpass, a read voltage Vread, and an erase voltage Vers.

The voltages generated by the voltage generating unit 550 may be supplied to the address decoder 520 and the memory cell array 510 based on a control of the control logic 560. For example, the program voltage Vpgm and the pass voltage Vpass may be supplied to the address decoder 520 during a program operation. The read voltage Vread may be supplied to the address decoder 520 during a read operation. The erase voltage Vers may be supplied to the memory cell array 510 during an erasing operation.

Voltages generated by the voltage generating unit 550 are not limited to the above-mentioned voltages.

The control logic 560 may be connected to the address decoder 520, the read and write unit 530, and the data I/O unit 540. The control logic 560 may control general operations of the memory device 500. The control logic 560 may operate in response to a control signal CTRL delivered from the external device.

Figure 17:
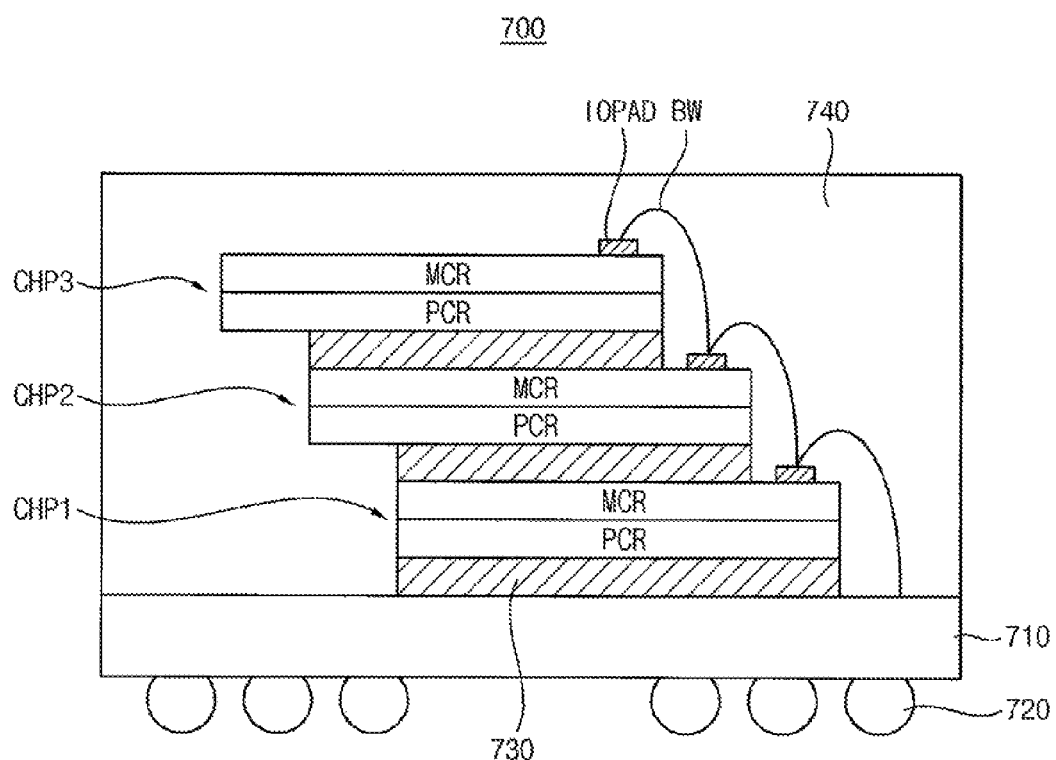
FIGS. 17 and 18 are diagrams illustrating a memory package according to an exemplary embodiment of the present inventive concept.
Figure 18:
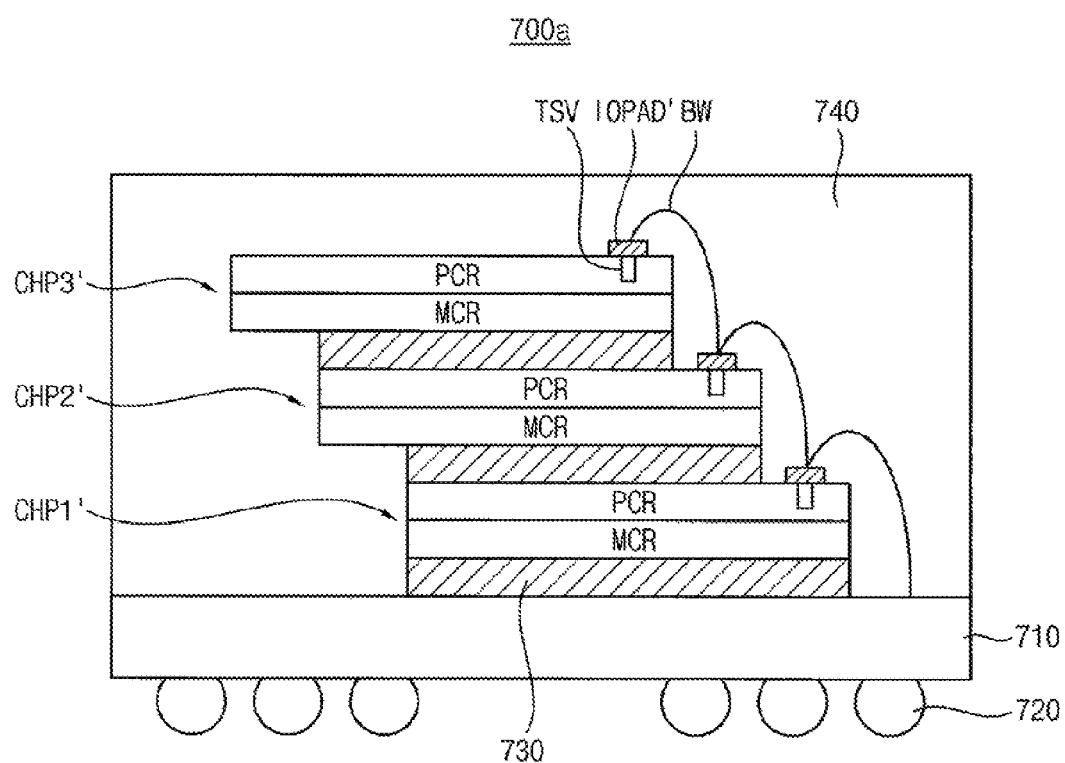

FIGS. 17 and 18 are diagrams illustrating a memory package according to an exemplary embodiment of the present inventive concept.

Referring to FIG. 17, a memory package 700 includes a base substrate 710 and a plurality of memory chips CHP1, CHP2 and CHP3 stacked on the base substrate 710.

Each of the memory chips CHP1-CHP3 may include a peripheral circuit region PCR and a memory cell region MCR, and may further include a plurality of I/O pads IOPAD. The peripheral circuit region PCR may include a semiconductor substrate, a peripheral circuit disposed on a first surface (e.g., a top surface) of the semiconductor substrate 730, and a first wiring layer disposed on the peripheral circuit. Further, the peripheral circuit may include at least one transistor. The memory cell region MCR may include a base layer disposed on the first wiring layer, a memory cell array disposed on the base layer, and a second wiring layer on the memory cell array. The plurality of I/O pads IOPAD may be disposed on the second wiring layer.

Each of the memory chips CHP1-CHP3 may be implemented with the memory device according to an exemplary embodiment of the present inventive concept. For example, the second wiring layer (e.g., an upper wiring layer) in each of the memory chips CHP1-CHP3 may include at least one upper wiring that is electrically connected to the at least one transistor in the peripheral circuit. The at least one upper wiring may be electrically connectable to one of power wirings, and thus the power option for the at least one transistor may be efficiently and easily selected based on the at least one upper wiring, by changing connection of the upper wiring and one of the power wirings.

In an exemplary embodiment of the present inventive concept, the memory chips CHP1-CHP3 may be stacked on the base substrate 710 such that a surface on which the plurality of I/O pads IOPAD may be disposed faces upwards. For example, the memory chips CHP1-CHP3 may be stacked in a downside-down state such that a second surface (e.g., a bottom surface) of the semiconductor substrate 730 of each memory chip faces downwards. In other words, with respect to each of the memory chips CHP1-CHP3, the memory cell region MCR may be located on the peripheral circuit region PCR.

In an exemplary embodiment of the present inventive concept, with respect to each of the memory chips CHP1-CHP3, the plurality of I/O pads IOPAD may be arranged near one side of the semiconductor substrate. As such, the memory chips CHP1-CHP3 may be stacked scalariformly, that is, in a step shape, such that the plurality of I/O pads IOPAD of each memory chip may be exposed (e.g., the plurality of I/O pads IOPAD maybe exposed on the edge of each step). In such stacked state, the memory chips CHP1-CHP3 may be electrically connected to the base substrate 710 through a plurality of bonding wires BW.

The stacked memory chips CHP1-CHP3 and the bonding wires BW may be fixed by a sealing member 740, and adhesive members 730 may intervene between the base substrate 710 and the memory chips CHP1-CHP3. Conductive bumps 720 may be disposed on a bottom surface of the base substrate 710 for electrical connections to the external device.

Referring to FIG. 18, a memory package 700a includes a base substrate 710 and a plurality of memory chips CHP1', CHP2' and CHP3' stacked on the base substrate 710.

The memory package 700a of FIG. 18 may be substantially the same as the memory package 700 of FIG. 17, except that an arrangement of a plurality of I/O pads IOPAD' and a stacked structure of the memory chips CHP1'-CHP3' are changed in the memory package 700a of FIG. 18.

Each of the memory chips CHP1'-CHP3' may include a peripheral circuit region PCR and a memory cell region MCR, and may further include the plurality of I/O pads IOPAD'. The peripheral circuit region PCR may include a semiconductor substrate, a peripheral circuit disposed on a first surface (e.g., a top or upper surface) of the semiconductor substrate, and a first wiring layer disposed on the peripheral circuit. The peripheral circuit may include at least one transistor. The memory cell region MCR may include a base layer disposed on the first wiring layer, a memory cell array disposed on the base layer, and a second wiring layer on the memory cell array.

The plurality of I/O pads IOPAD' may be disposed on a second surface (e.g., a bottom surface) of the semiconductor substrate opposite to the first surface of the semiconductor substrate. The I/O pads IOPAD' may cover through-substrate vias TSV disposed in the peripheral circuit region PCR. Then, the I/O pads IOPAD' may be electrically connected to at least one lower wiring that is included in the first wiring layer (e.g., a lower wiring layer) of the peripheral circuit region PCR.

With respect to each of the memory chips CHP1'-CHP3', the plurality of I/O pads IOPAD' may overlap, in a vertical direction, with a portion of the memory cell region MCR where the memory cell array is disposed.

In some exemplary embodiments of the present inventive concept, the memory chips CHP1'-CHP3' may be stacked on the base substrate 710 such that a surface on which the plurality of I/O pads IOPAD' may be disposed faces upwards. For example, the memory chips CHP1'-CHP3' may be stacked in an upside-down state such that the second surface (e.g., the bottom surface) of the semiconductor substrate of each memory chip faces upwards. In other words, with respect to each of the memory chips CHP1'-

CHP3', the memory cell region MCR may be located under the peripheral circuit region PCR.

Figure 19:
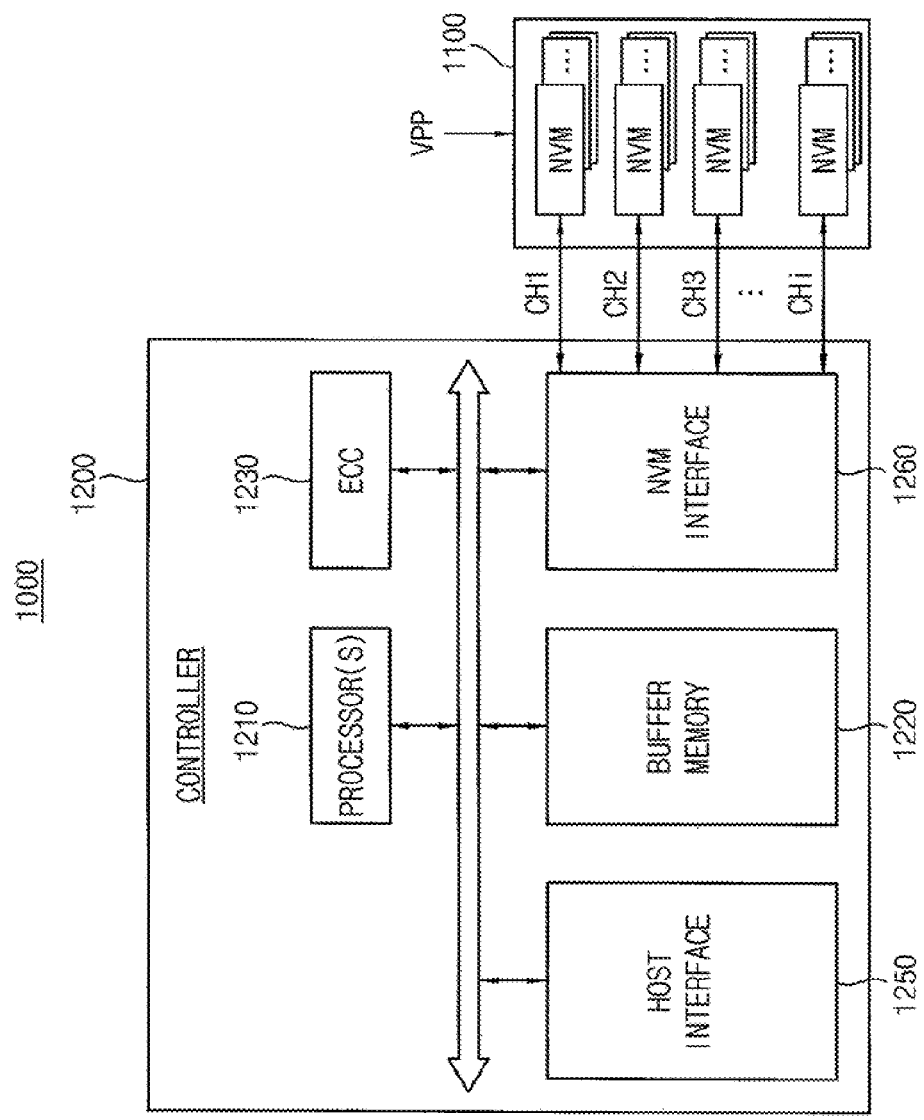
FIG. 19 is a block diagram illustrating a solid state disc or solid state drive (SSD) according to an exemplary embodiment of the present inventive concept.

FIG. 19 is a block diagram illustrating a solid state disc or solid state drive (SSD) according to an exemplary embodiment of the present inventive concept.

Referring to FIG. 19, a SSD 1000 may include multiple nonvolatile memory devices 1100 and a SSD controller 1200.

The nonvolatile memory devices 1100 may be optionally supplied with an external high voltage VPP. Each of the nonvolatile memory devices 1100 may include the above-described vertical NAND flash memory device. The nonvolatile memory devices 1100 may have the COP structure and the upper wiring layer including the upper wirings according to an exemplary embodiment of the present inventive concept, as described with reference to FIGS. 1 through 18.

The SSD controller 1200 may be connected to the nonvolatile memory devices 1100 through multiple channels CH1, CH2, CH3 . . . CHi. The SSD controller 1200 may include one or more processors 1210, a buffer memory 1220, an error correction code (ECC) block 1230, a host interface 1250, and a nonvolatile memory interface 1260.

The buffer memory 1220 may store data used to drive the SSD controller 1200. The buffer memory 1220 may include multiple memory lines each storing data or a command. Although FIG. 19 illustrates an exemplary embodiment of the present inventive concept where the buffer memory 1220 is included in the SSD controller 1200, the inventive concept is not limited thereto. For example, the buffer memory 1220 may be located outside the SSD controller 1200.

The ECC block 1230 may calculate error correction code values of data and may be programmed during a program operation, and may correct an error of read data using an error correction code value during a read operation. In a data recovery operation, the ECC block 1230 may correct an error of data recovered from the nonvolatile memory devices 1100. In addition, a code memory may be further included to store code data needed to drive the SSD controller 1200. The code memory may be implemented by a nonvolatile memory device.

The host interface 1250 may provide an interface with an external device. The nonvolatile memory interface 1260 may provide an interface with the nonvolatile memory devices 1100.

Figure 20:
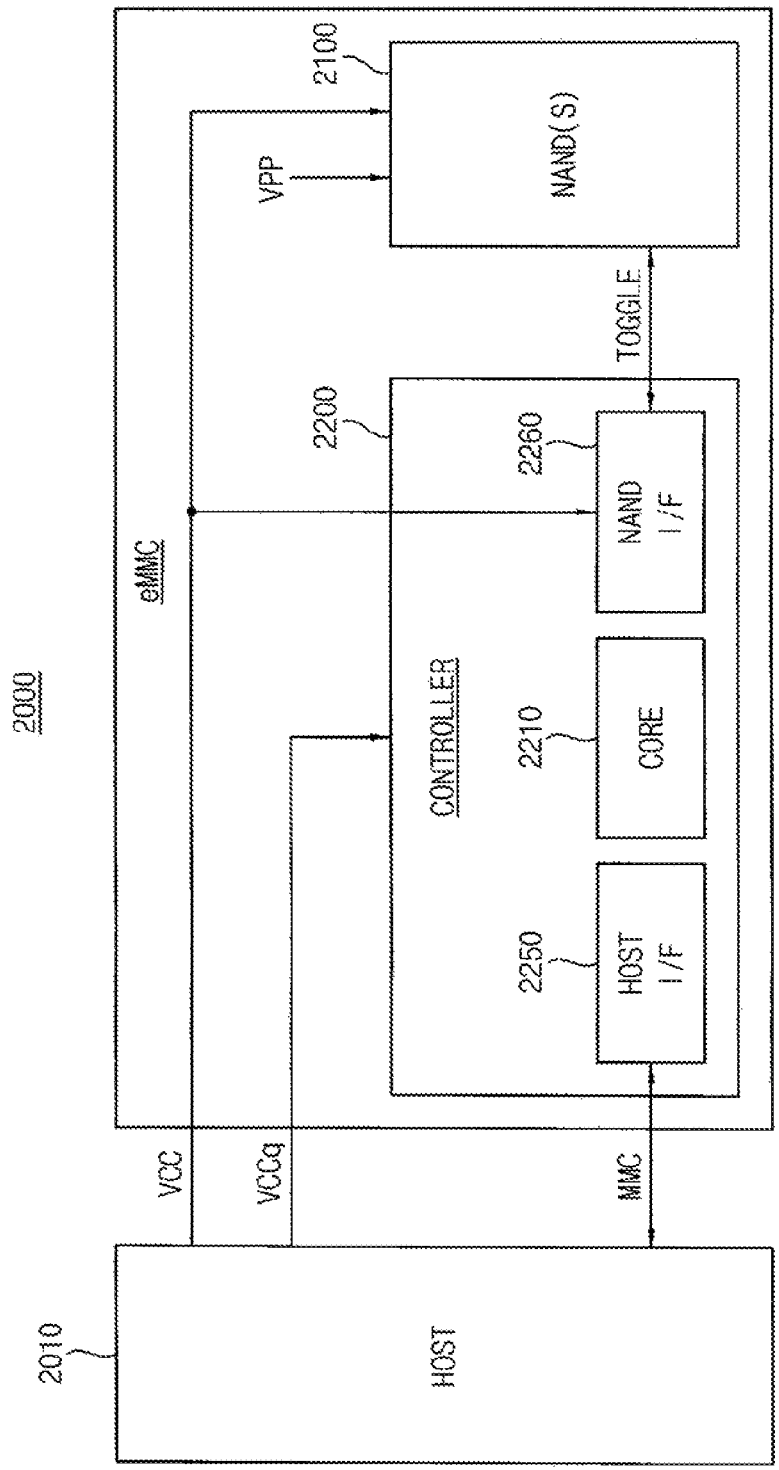
FIG. 20 is a block diagram illustrating an embedded multi-media card (eMMC) according to an exemplary embodiment of the present inventive concept.

FIG. 20 is a block diagram illustrating an embedded multi-media card (eMMC) according to an exemplary embodiment of the present inventive concept.

Referring to FIG. 20, an eMMC 2000 may include one or more NAND flash memory devices 2100 and a controller 2200.

The NAND flash memory device 2100 may have the COP structure and the upper wiring layer including the upper wirings according to an exemplary embodiment of the present inventive concept, as described with reference to FIGS. 1 through 18.

The controller 2200 may be connected with the NAND flash memory device 2100 via multiple channels. The controller 2200 may include one or more controller cores 2210, a host interface 2250, and a NAND interface 2260. The controller core 2210 may control an overall operation of the eMMC 2000. The host interface 2250 may perform an interface between the controller 2200 and a host 2010. The NAND interface 2260 may provide an interface between the NAND flash memory device 2100 and the controller 2200.

In an exemplary embodiment of the present inventive concept, the host interface 2250 may be a parallel interface (e.g., an MMC interface). In other exemplary embodiments of the present inventive concept, the host interface 2250 may be a serial interface (e.g., UHS-II, UFS, etc.).

The eMMC 2000 may receive power supply voltages VCC and VCCq from a host 2010. For example, the power supply voltage VCC (e.g., about 3.3V) may be supplied to the NAND flash memory device 2100 and the NAND interface 2260, and the power supply voltage VCCq (e.g., about 1.8V/3.3V) may be supplied to the controller 2200. In an exemplary embodiment of the present inventive concept, the eMMC 2000 may be optionally supplied with an external high voltage VPP. Further, the external high voltage VPP may be optionally supplied to the NAND flash memory device 2100.

Figure 21:
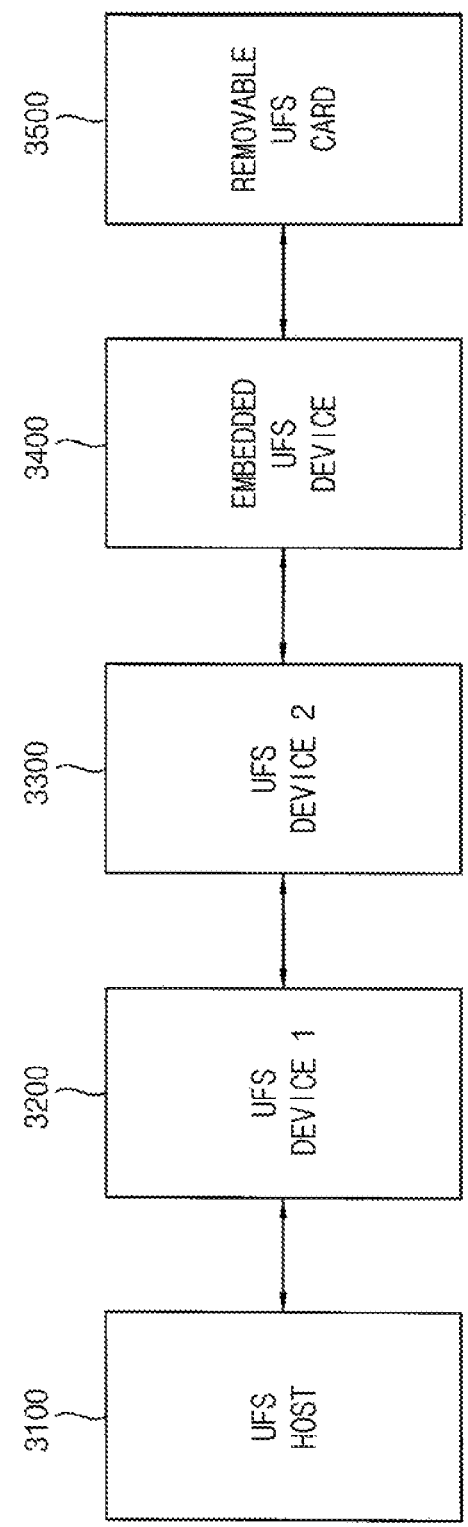
FIG. 21 is a block diagram illustrating a universal flash storage (UFS) according to an exemplary embodiment of the present inventive concept.

FIG. 21 is a block diagram illustrating a universal flash storage (UFS) according to an exemplary embodiment of the present inventive concept.

Referring to FIG. 21, a UFS system 3000 may include a UFS host 3100, UFS devices 3200 and 3300, an embedded UFS device 3400, and a removable UFS card 3500.

The UFS host 3100 may be an application processor of a mobile device. Each of the UFS host 3100, the UFS devices 3200 and 3300, the embedded UFS device 3400 and the removable UFS card 3500 may communicate with external devices through the UFS protocol. At least one of the UFS devices 3200 and 3300, the embedded UFS device 3400, and the removable UFS card 3500 may be implemented by a nonvolatile memory device. The nonvolatile memory device may have the COP structure and the upper wiring layer including the upper wirings according to an exemplary embodiment of the present inventive concept, as described with reference to FIGS. 1 through 18.

The embedded UFS device 3400 and the removable UFS card 3500 may perform communications using protocols different from the UFS protocol. The UFS host 3100 and the removable UFS card 3500 may communicate through various card protocols (e.g., UFDs, MMC, secure digital (SD), mini SD, Micro SD, etc.).

Figure 22:
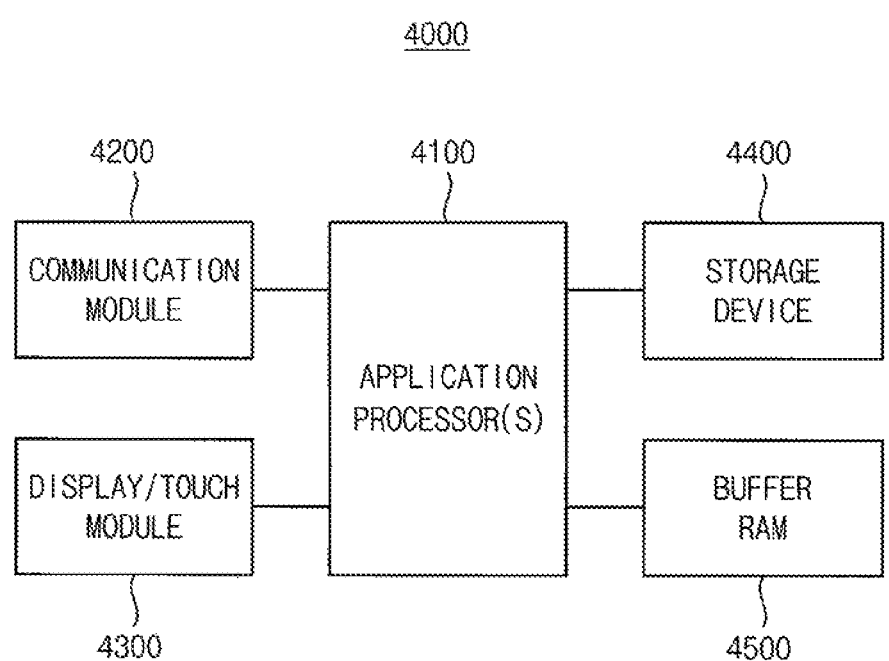
FIG. 22 is a block diagram illustrating a mobile device according to an exemplary embodiment of the present inventive concept.

FIG. 22 is a block diagram illustrating a mobile device according to an exemplary embodiment of the present inventive concept.

Referring to FIG. 22, a mobile device 4000 may include an application processor 4100, a communication module 4200, a display/touch module 4300, a storage device 4400, and a mobile random access memory (RAM) (e.g., buffer RAM) 4500.

The application processor 4100 may control operations of the mobile device 4000. The communication module 4200 may be implemented to perform wireless or wire communications with an external device. The display/touch module 4300 may be implemented to display data processed by the application processor 4100 or to receive data through a touch panel. The storage device 4400 may be implemented to store user data. The mobile RAM (e.g., buffer RAM) 4500 may temporarily store data used for processing operations of the mobile device 4000.

In an exemplary embodiment of the present inventive concept, the storage device 4400 may be, for example, eMMC, SSD, UFS device, etc. The storage device 4400 may include a nonvolatile memory device. The nonvolatile memory device may have the COP structure and the upper wiring layer including the upper wirings according to exemplary embodiments of the present inventive concept, as described with reference to FIGS. 1 through 18.

A memory device or a storage device according to an exemplary embodiment of the present inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present disclosure may be applied to various devices and systems. For example, the present disclosure may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, etc.

The foregoing is illustrative of exemplary embodiments of the present inventive concept and is not to be construed as limiting thereof. Although a few exemplary embodiments have been described, those skilled in the art will readily appreciate that many modifications are possible in the exemplary embodiments without materially departing from the novel teachings of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A memory device comprising:
   a substrate;
   a peripheral circuit disposed on a first surface of the substrate, wherein the peripheral circuit includes a first transistor;
   a first wiring layer disposed on the peripheral circuit;
   a base layer disposed on the first wiring layer;
   a memory cell array disposed on the base layer; and
   a second wiring layer disposed on the memory cell array, wherein the second wiring layer comprises:
      a first power wiring configured to supply a first voltage;
      a second power wiring configured to supply a second voltage; and
      a first wiring electrically connected to the first transistor, wherein the first wiring is configured to be electrically connectable to either the first power wiring or the second power wiring.

2. The memory device of claim 1, wherein each of the first and second power wirings extends in a first direction, and the first and second power wirings are spaced apart from each other,
   wherein the first wiring is disposed between the first and second power wirings.

3. The memory device of claim 1, wherein the first and second power wirings and the first wiring are disposed on a same plane.

4. The memory device of claim 1, wherein the first wiring is electrically connected to a gate electrode of the first transistor.

5. The memory device of claim 4, further comprising:
   first and second contacts disposed through a portion of an insulation layer included in the first wiring layer.

6. The memory device of claim 5, wherein the first contact electrically connects the gate electrode of the first transistor with a second wiring included in the first wiring layer,
   wherein the second contact electrically connects the first wiring with the second wiring.

7. The memory device of claim 1, wherein the peripheral circuit further includes a second transistor,
   wherein the second wiring layer further includes a second wiring electrically connected to the second transistor,
   wherein the second wiring is configured to be electrically connectable to the first power wiring or the second power wiring.

8. The memory device of claim 1, wherein the peripheral circuit further includes a second transistor,
   wherein the second wiring layer further includes:
      a third power wiring configured to supply the first voltage; and
      a second wiring electrically connected to the second transistor, the second wiring configured to be electrically connectable to one of the second power wiring or the third power wiring.

9. The memory device of claim 8, wherein each of the first, second and third power wirings extends in a first direction, and the first, second and third power wirings are spaced apart from each other,
   wherein the first wiring is arranged between the first and second power wirings, and the second wiring is arranged between the second and third power wirings.

10. The memory device of claim 1, wherein the first voltage is a power supply voltage, and the second voltage is a ground voltage.

11. The memory device of claim 1, wherein the base layer includes polysilicon or crystalline silicon.

12. The memory device of claim 11, wherein the base layer is divided into a plurality of base layer patterns, and each of the plurality of base layer patterns serves as a p-type well.

13. The memory device of claim 1, wherein the memory cell array includes a plurality of vertical NAND flash memory cells.

14. The memory device of claim 1, wherein the memory cell array includes:
   a plurality of channels extending in a first direction that is perpendicular to the first surface; and
   a plurality of gate lines surrounding outer sidewalls of the channels, the gate lines being stacked in the first direction and spaced apart from each other.

15. A memory package comprising:
   a base substrate; and
   a plurality of memory chips stacked on the base substrate, each of the plurality of memory chips comprising:
      a substrate;
      a peripheral circuit disposed on a first surface of the substrate, wherein the peripheral circuit includes a first transistor;
      a first wiring layer disposed on the peripheral circuit;
      a base layer disposed on the first wiring layer;
      a memory cell array disposed on the base layer; and
      a second wiring layer disposed on the memory cell array, wherein the second wiring layer comprises:
         a first power wiring configured to supply a first voltage;
         a second power wiring configured to supply a second voltage; and a first wiring electrically connected to the first transistor, wherein the first wiring is configured to be electrically connectable to the first power wiring or the second power wiring.

16. A memory device comprising:
a substrate;
a peripheral circuit disposed on a first surface of the substrate, the peripheral circuit includes a first transistor and a second transistor;
a lower wiring layer disposed on the peripheral circuit;
a base layer disposed on the lower wiring layer;
a memory cell array disposed on the base layer, wherein the memory cell array includes a plurality of channels; and
an upper wiring layer disposed on the memory cell array, wherein the upper wiring layer comprises:
at least two power wirings, wherein a first power wiring of the at least two power wirings is configured to supply a first voltage and a second power wiring of the at least two power wirings is configured to supply a second voltage;
a first wiring electrically connected to the first transistor, wherein the first wiring is configured to be electrically connectable to either the first or second power wirings; and
a second wiring electrically connected to the second transistor, wherein the second wiring is configured to be electrically connectable to either the first or second power wirings.

17. The memory device of claim 16, wherein the plurality of channels are arranged in a second direction to form at least one channel row, and channels, of the plurality of channels, disposed in neighboring rows are arranged in a zigzag manner.

18. The memory device of claim 16, wherein the base layer is divided into a plurality of base layer patterns by a plurality of separation layer patterns.

19. The memory device of claim 16, wherein the plurality of channels extends in a first direction that is perpendicular to the first surface of the substrate.

20. The memory device of claim 16, wherein the memory cell array includes a plurality of gate lines surrounding outer sidewalls of the channels, wherein the gate lines are stacked in a first direction, spaced apart from each other, and are shared by the plurality of channels.

* * * * *